(12) United States Patent
Olson et al.

(10) Patent No.: US 12,205,881 B2
(45) Date of Patent: Jan. 21, 2025

(54) SEMICONDUCTOR ASSEMBLY COMPRISING A 3D BLOCK AND METHOD OF MAKING THE SAME

(71) Applicant: Deca Technologies USA, Inc., Tempe, AZ (US)

(72) Inventors: Timothy L. Olson, Phoenix, AZ (US); Craig Bishop, Scottsdale, AZ (US); Robin Davis, Vancouver, WA (US); Paul R. Hoffman, San Diego, CA (US)

(73) Assignee: Deca Technologies USA, Inc., Tempe, AZ (US)

( * ) Notice: Subject to any disclaimer, the term of this patent is extended or adjusted under 35 U.S.C. 154(b) by 0 days.

(21) Appl. No.: 18/545,927

(22) Filed: Dec. 19, 2023

(65) Prior Publication Data
US 2024/0213135 A1 Jun. 27, 2024

Related U.S. Application Data

(60) Provisional application No. 63/435,185, filed on Dec. 23, 2022.

(51) Int. Cl.
*H01L 23/498* (2006.01)
*H01L 21/56* (2006.01)
(Continued)

(52) U.S. Cl.
CPC ...... *H01L 23/49838* (2013.01); *H01L 21/561* (2013.01); *H01L 21/568* (2013.01);
(Continued)

(58) Field of Classification Search
CPC ............ H01L 23/49838; H01L 21/561; H01L 21/568; H01L 24/24; H01L 24/82;
(Continued)

(56) References Cited

U.S. PATENT DOCUMENTS

| | | |
|---|---|---|
| 5,570,274 A | 10/1996 | Saito |
| 5,790,384 A | 8/1998 | Ahmad |

(Continued)

FOREIGN PATENT DOCUMENTS

| | | |
|---|---|---|
| CN | 102099911 A | 6/2011 |
| CN | 103715104 A | 4/2014 |
| CN | 104011851 A | 8/2014 |

*Primary Examiner* — Hoa C Nguyen
(74) *Attorney, Agent, or Firm* — Booth Udall Fuller, PLC; Bryce W. Burnham

(57) ABSTRACT

A method of making an assembly or package comprising 3D blocks may include forming a conductive element horizontally oriented over a first carrier, forming support material around the conductive element, and singulating the conductive element and the support material to form a plurality of 3D blocks. The method may further include rotating each of the plurality of 3D blocks and mounting the plurality of 3D blocks over a second carrier with the conductive traces of the 3D blocks vertically oriented to form a vertically oriented conductive element. A plurality of components may be disposed laterally offset from each of the plurality of 3D blocks, an encapsulant may be disposed thereover s to form a reconstituted panel that may be singulated to form a plurality of individual assemblies.

30 Claims, 26 Drawing Sheets

(51) Int. Cl.
*H01L 23/00* (2006.01)
*H01L 25/10* (2006.01)
*H01L 25/16* (2023.01)

(52) U.S. Cl.
CPC .............. *H01L 24/24* (2013.01); *H01L 24/82* (2013.01); *H01L 25/105* (2013.01); *H01L 25/16* (2013.01); *H01L 2224/24155* (2013.01); *H01L 2224/82005* (2013.01); *H01L 2224/82106* (2013.01); *H01L 2225/1035* (2013.01)

(58) Field of Classification Search
CPC ................... H01L 25/82; H01L 25/105; H01L 2224/24155; H01L 2224/82005; H01L 2224/82106; H01L 2225/1035
See application file for complete search history.

(56) References Cited

U.S. PATENT DOCUMENTS

| | | |
|---|---|---|
| 6,133,626 A | 10/2000 | Hawke |
| 6,294,406 B1 | 9/2001 | Bertin |
| 6,546,620 B1 | 4/2003 | Juskey |
| 7,807,512 B2 | 10/2010 | Lee |
| 8,426,246 B2 | 4/2013 | Toh |
| 8,487,435 B2 | 7/2013 | Juskey |
| 9,040,316 B1 | 5/2015 | Scanlan |
| 9,082,806 B2 | 7/2015 | Lin |
| 9,269,622 B2 | 2/2016 | Scanlan |
| 9,391,041 B2 * | 7/2016 | Lin ............... H01L 24/09 |
| 9,502,397 B1 | 11/2016 | Scanlan |
| 9,601,463 B2 * | 3/2017 | Yu ............... H01L 24/20 |
| 11,024,605 B2 | 6/2021 | Chen |
| 11,276,656 B2 * | 3/2022 | Chen ............... H01L 24/20 |
| 11,502,062 B2 | 11/2022 | Chen |
| 11,638,348 B2 * | 4/2023 | Grosse ............... H05K 1/0313 |
| | | 174/254 |
| 2003/0230804 A1 | 12/2003 | Kouno |
| 2009/0008765 A1 | 1/2009 | Yamano |
| 2014/0048906 A1 | 2/2014 | Shim |
| 2014/0110858 A1 | 4/2014 | Beer |
| 2014/0159251 A1 | 6/2014 | Marimuthu |
| 2015/0044418 A1 | 2/2015 | Sreetharan |
| 2015/0108661 A1 | 4/2015 | Mncent |
| 2015/0251903 A1 | 9/2015 | Bowles |
| 2016/0013076 A1 | 1/2016 | Mncent |
| 2017/0288176 A1 | 10/2017 | Beer |
| 2019/0304807 A1 | 10/2019 | Baloglu |
| 2023/0042063 A1 * | 2/2023 | Bae ............... H01L 25/0657 |
| 2023/0420409 A1 * | 12/2023 | Suthram ............... H01L 24/94 |
| 2023/0420412 A1 * | 12/2023 | Tanaka ............... H01L 23/5385 |
| 2024/0106146 A1 * | 3/2024 | Cuvillier ............... B29C 45/14778 |

* cited by examiner

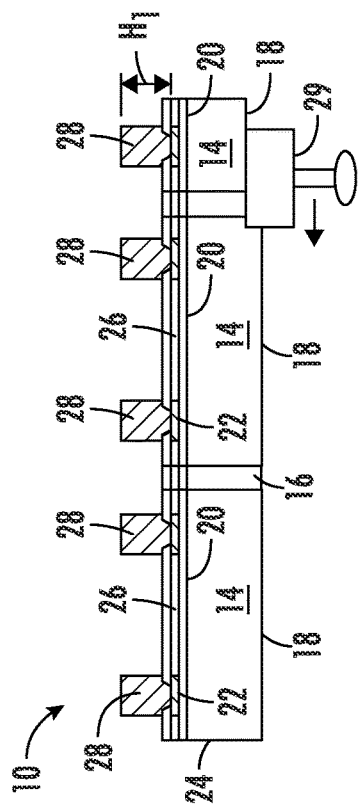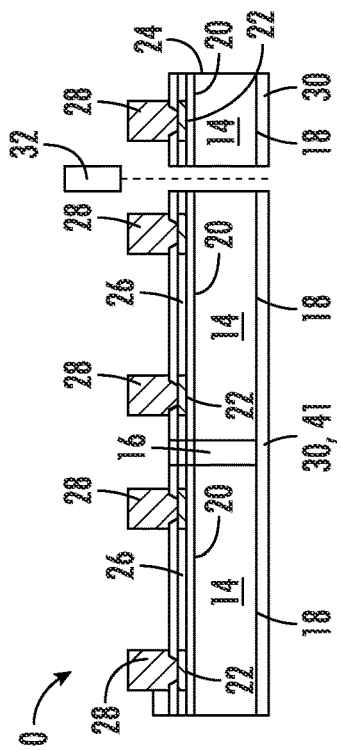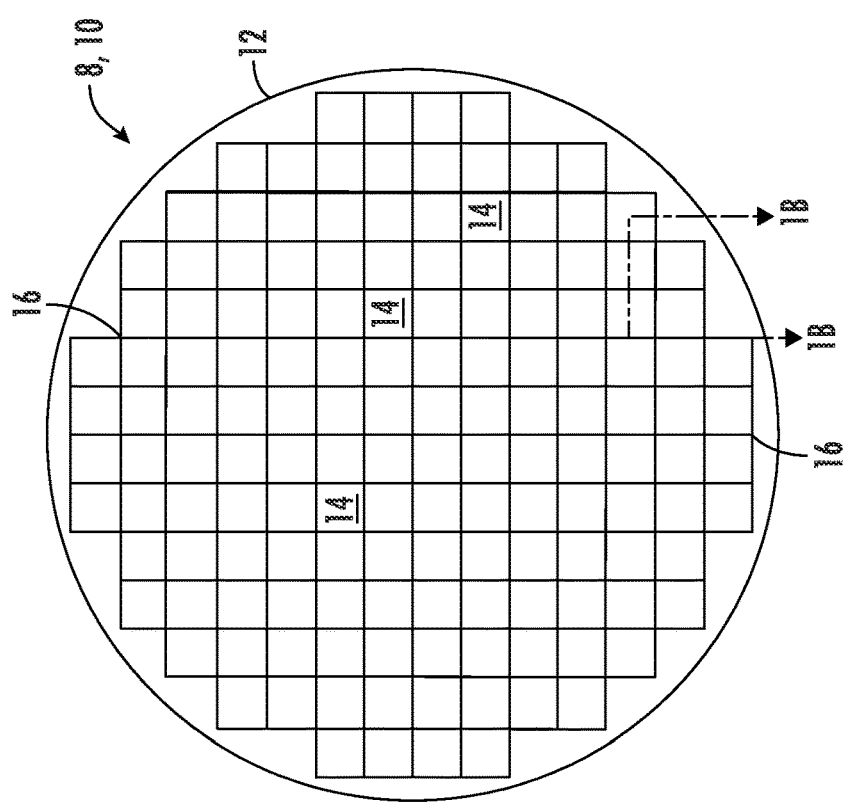

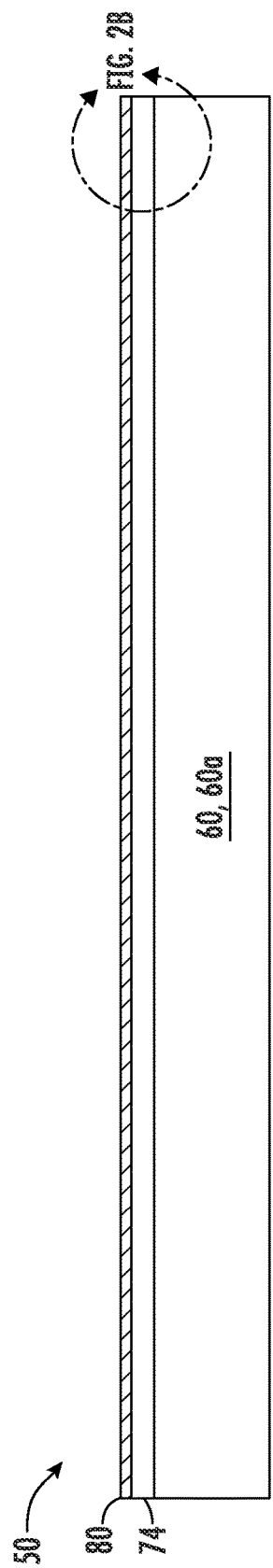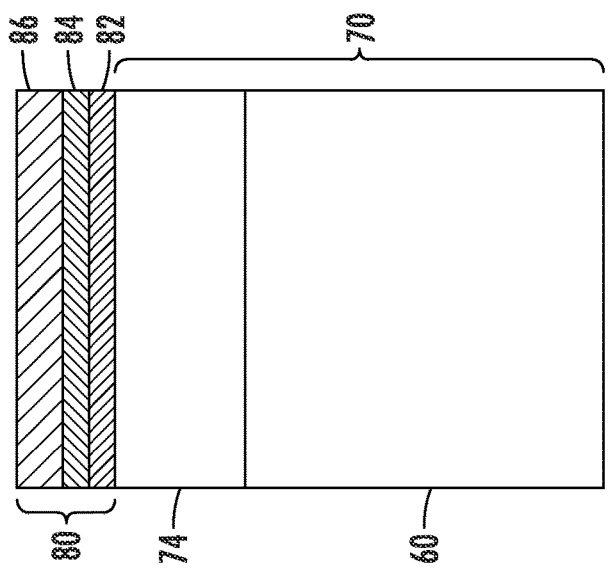

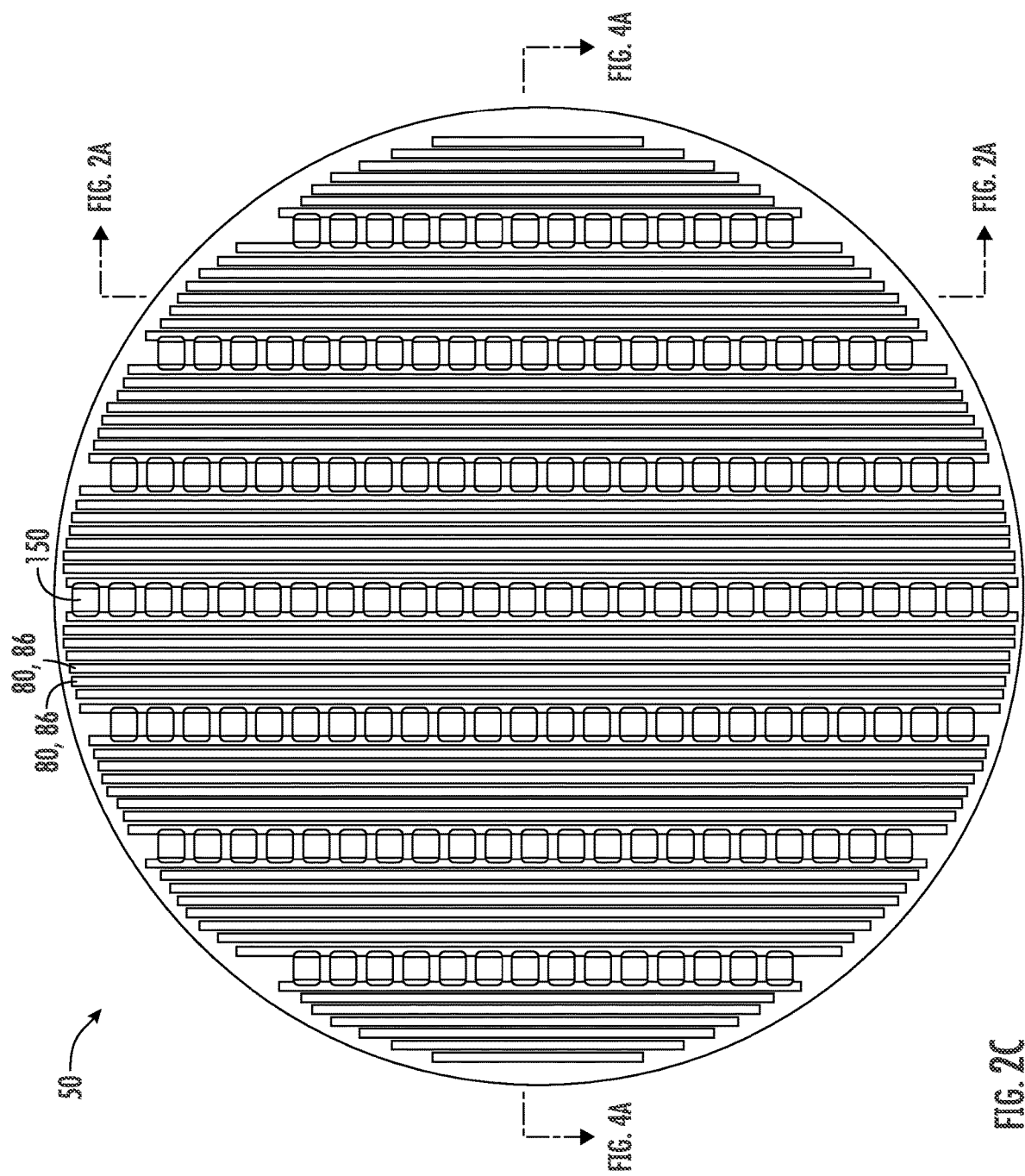

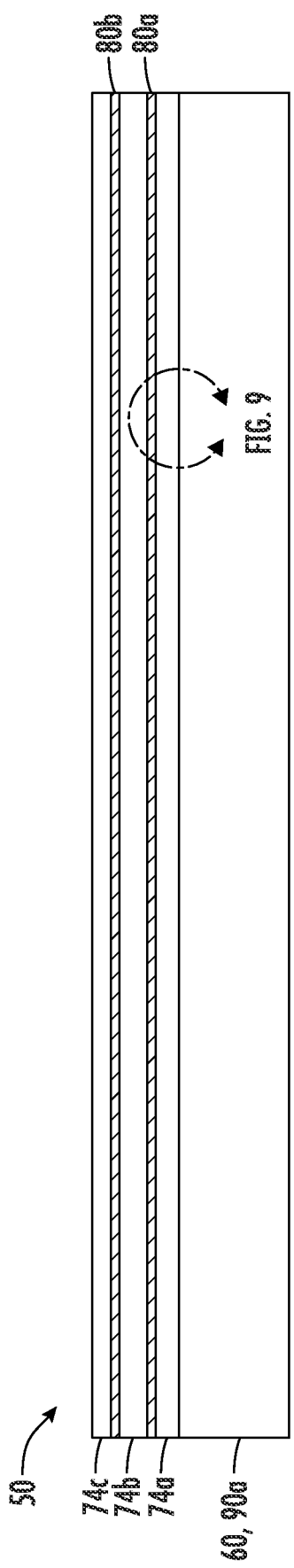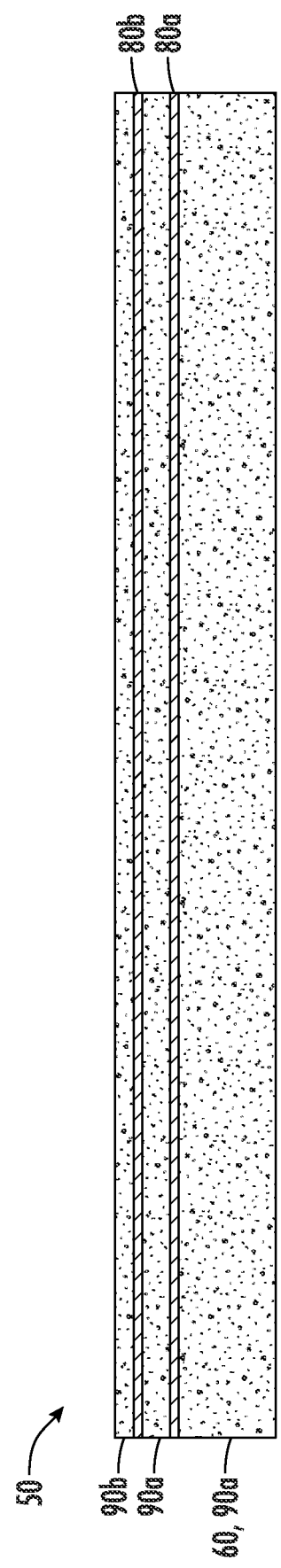

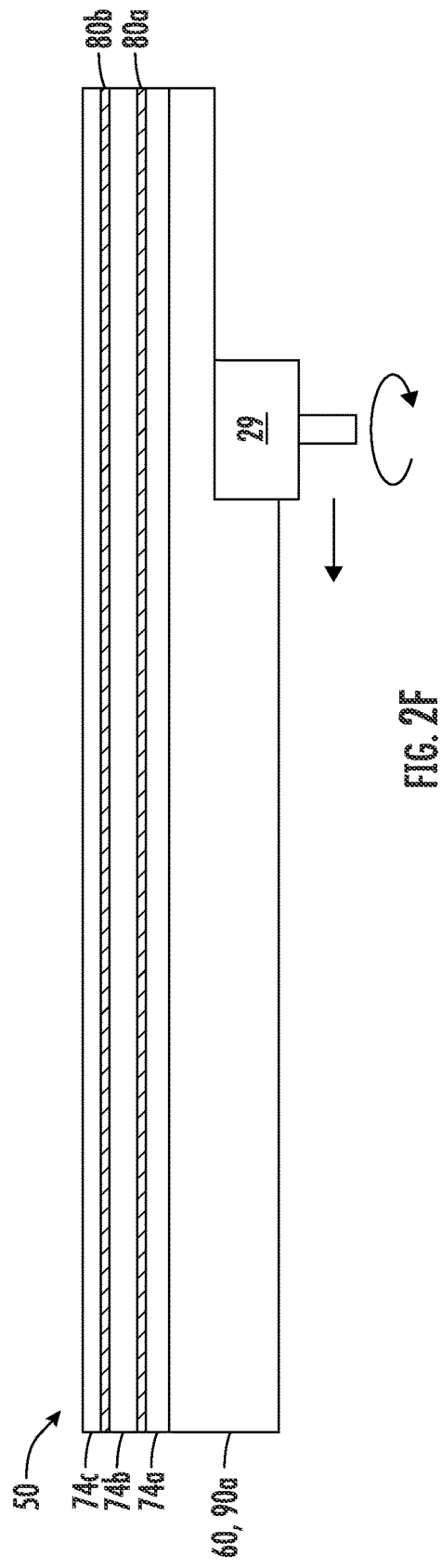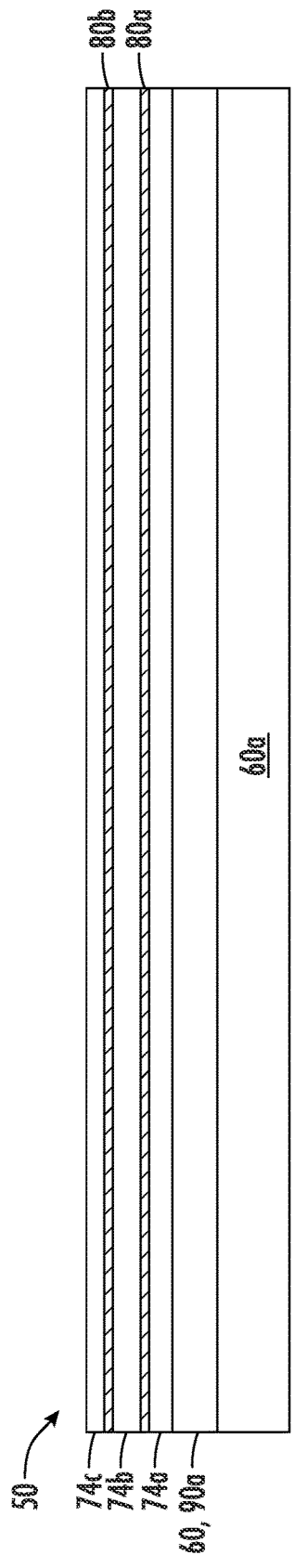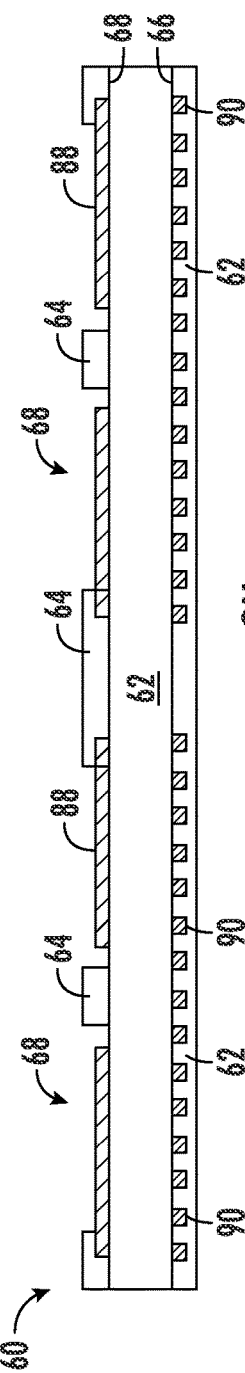

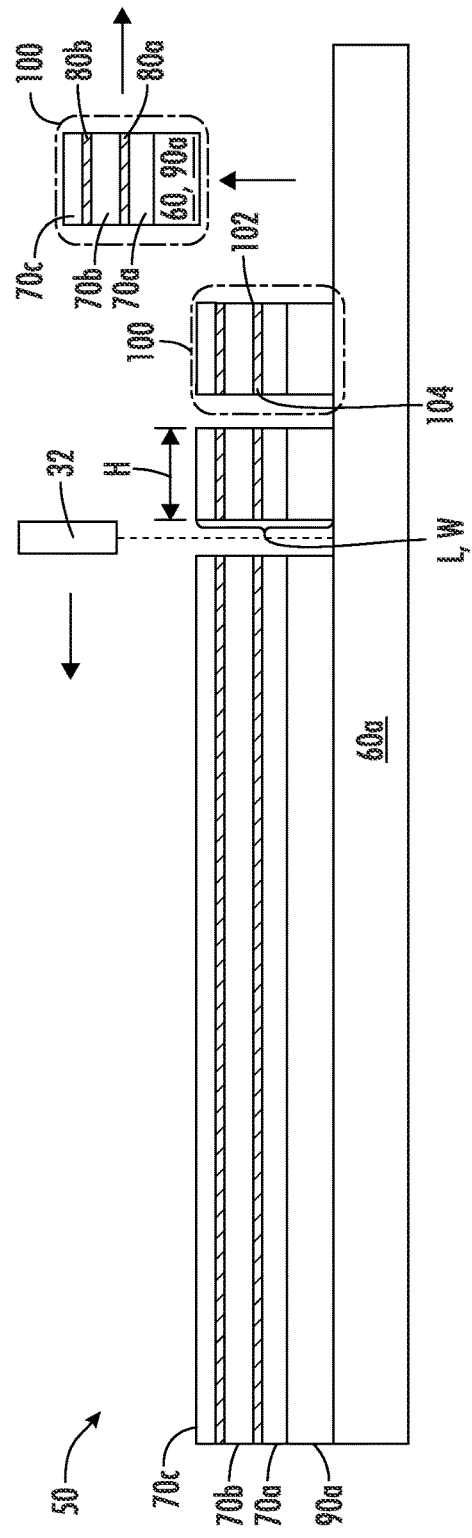
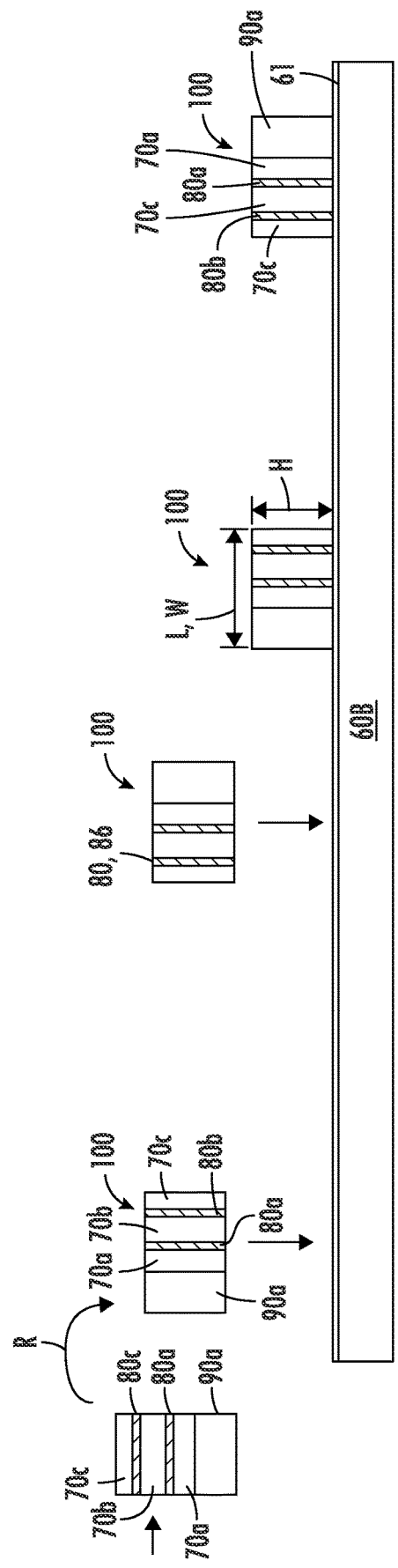

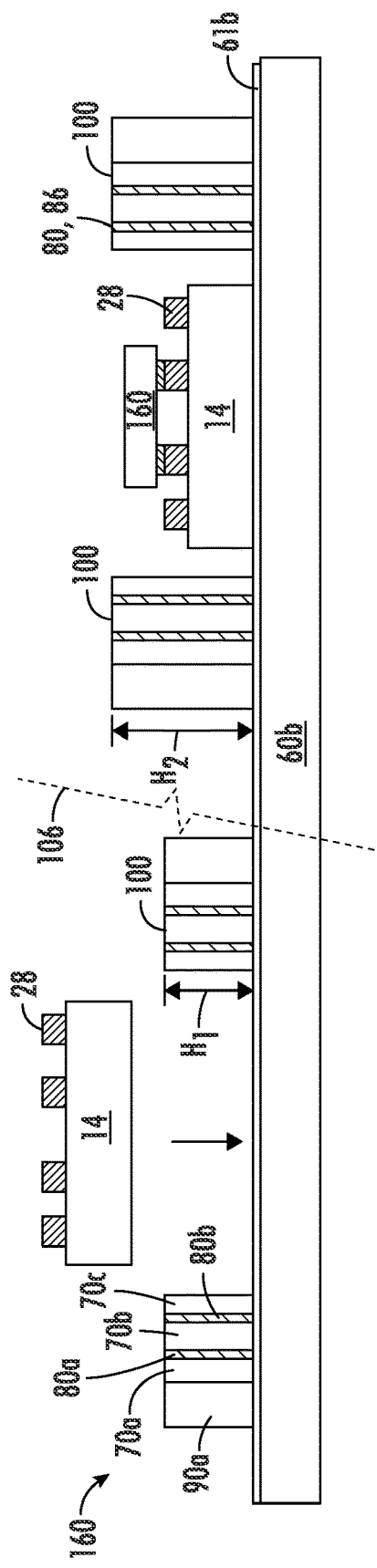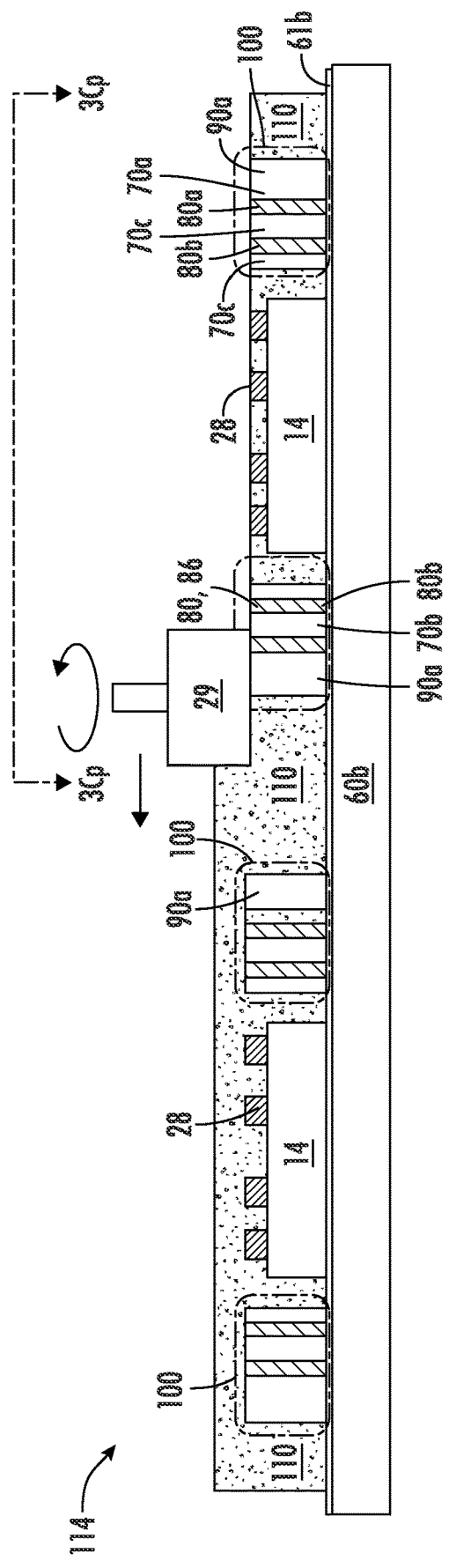

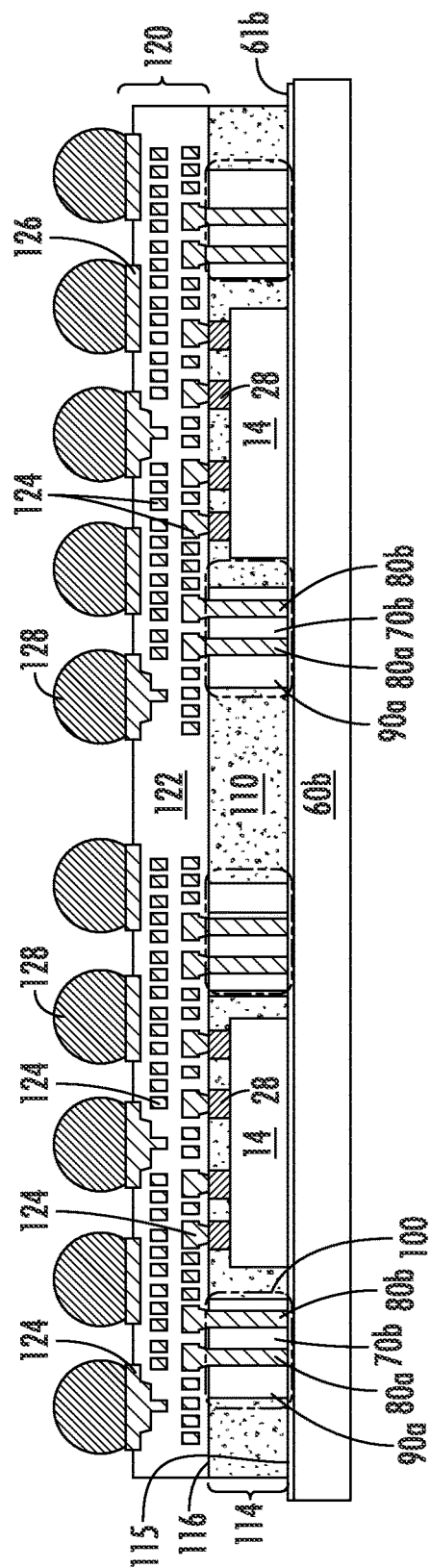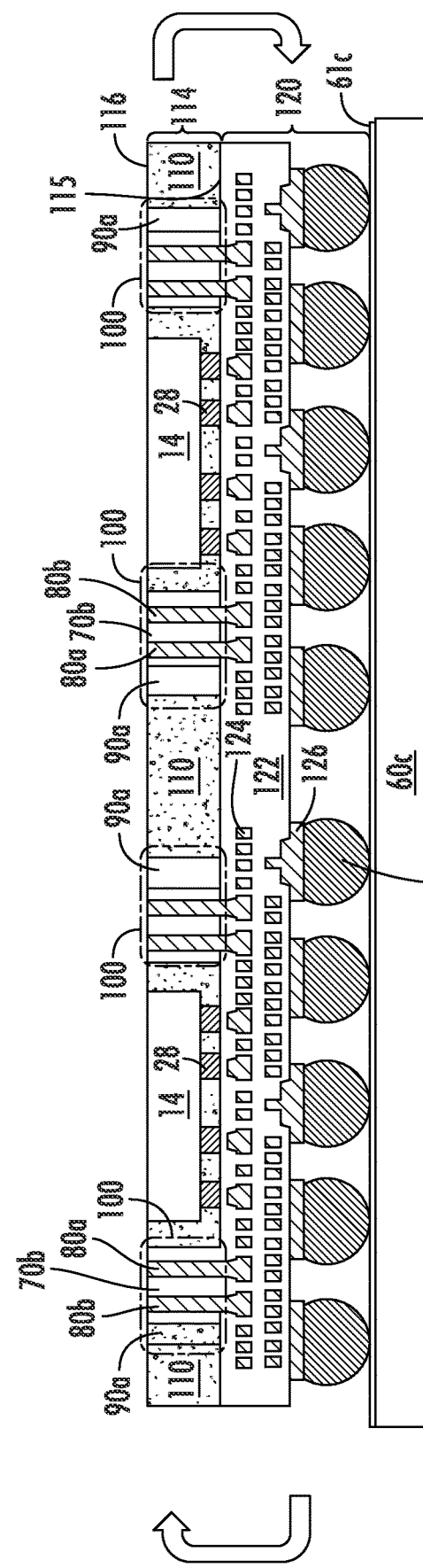

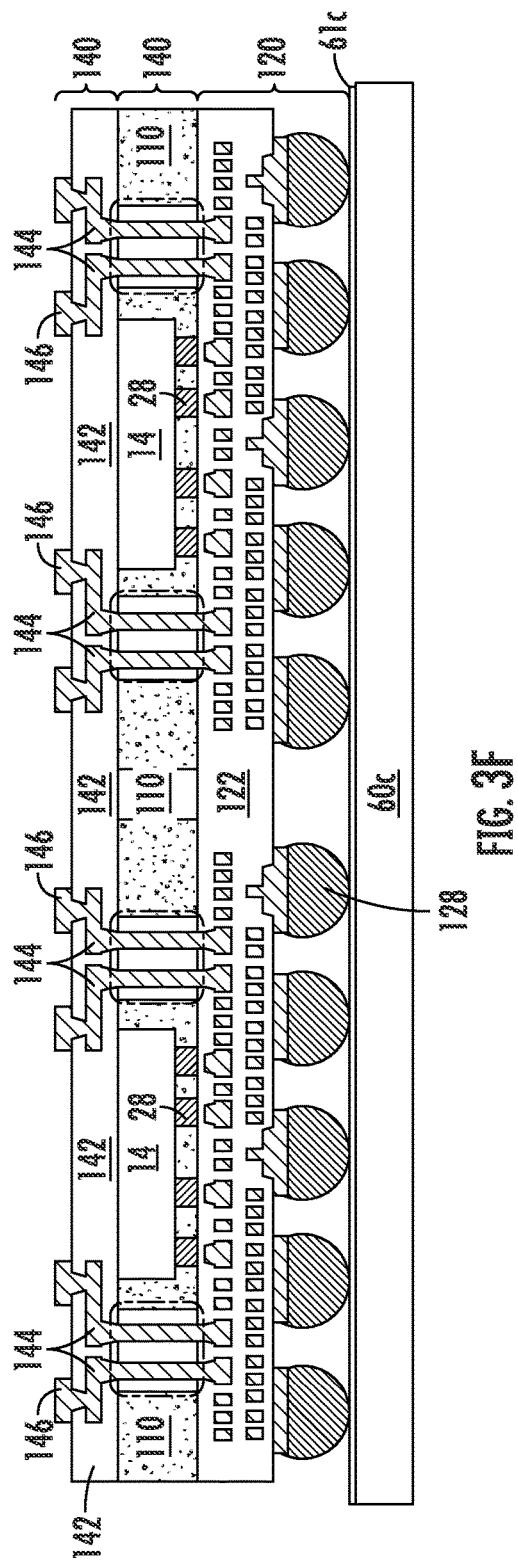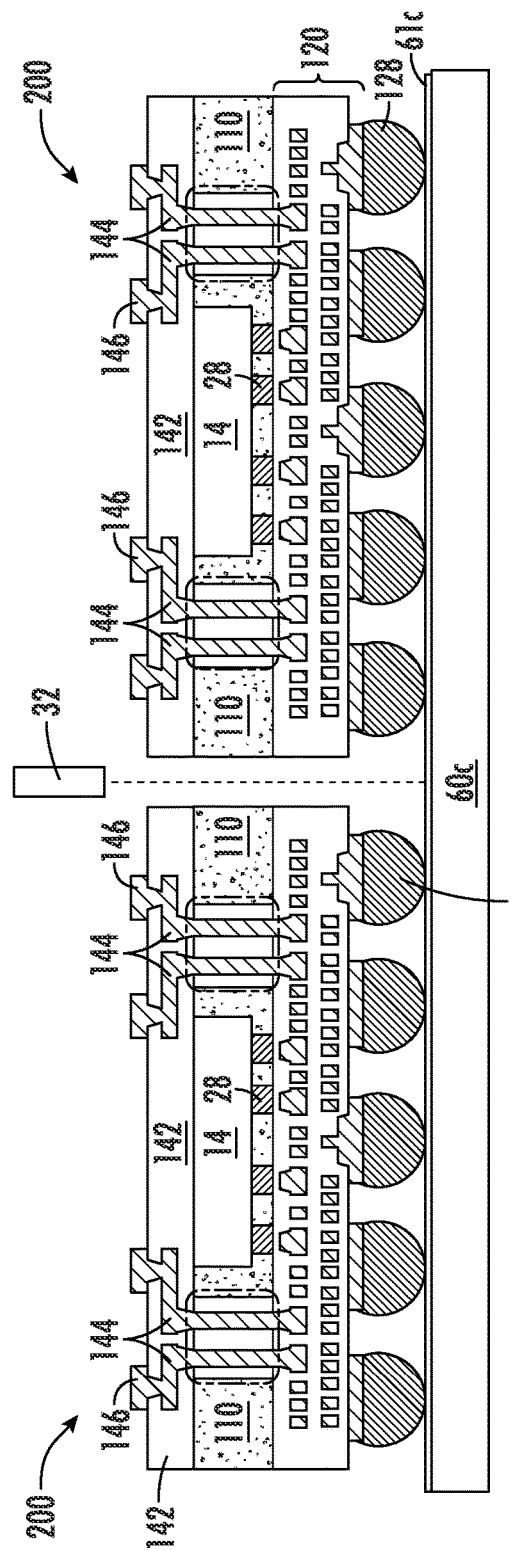

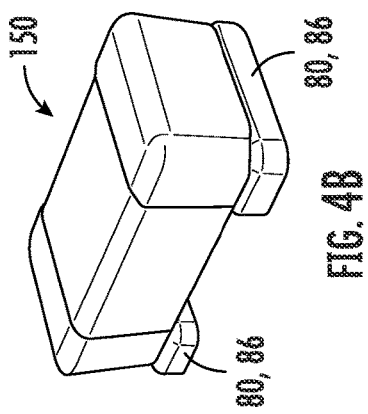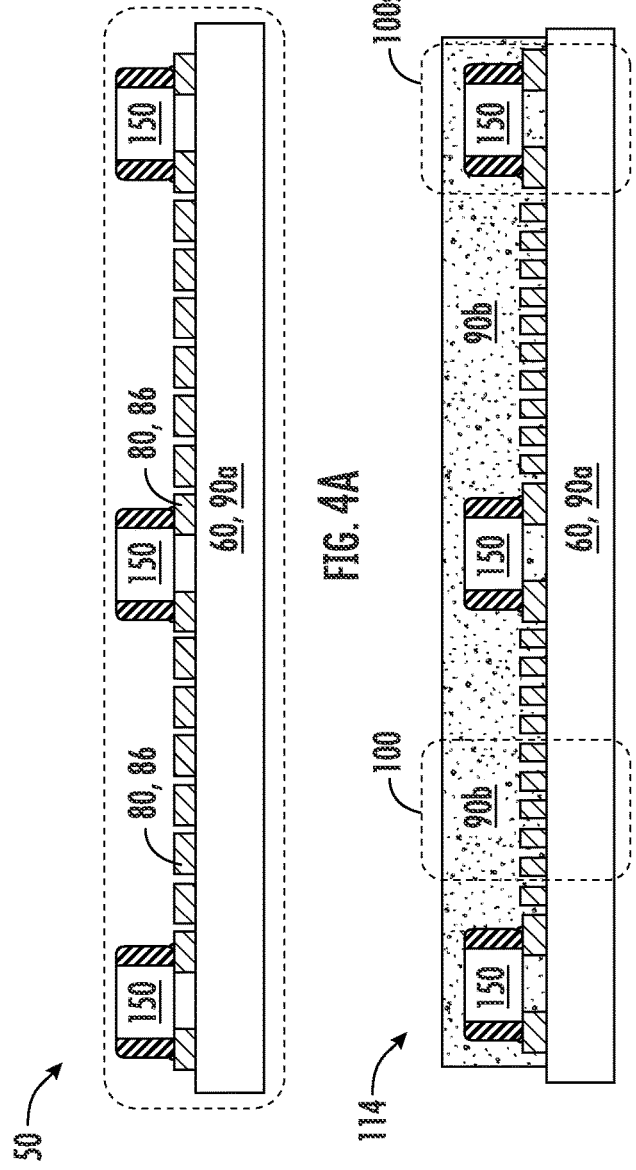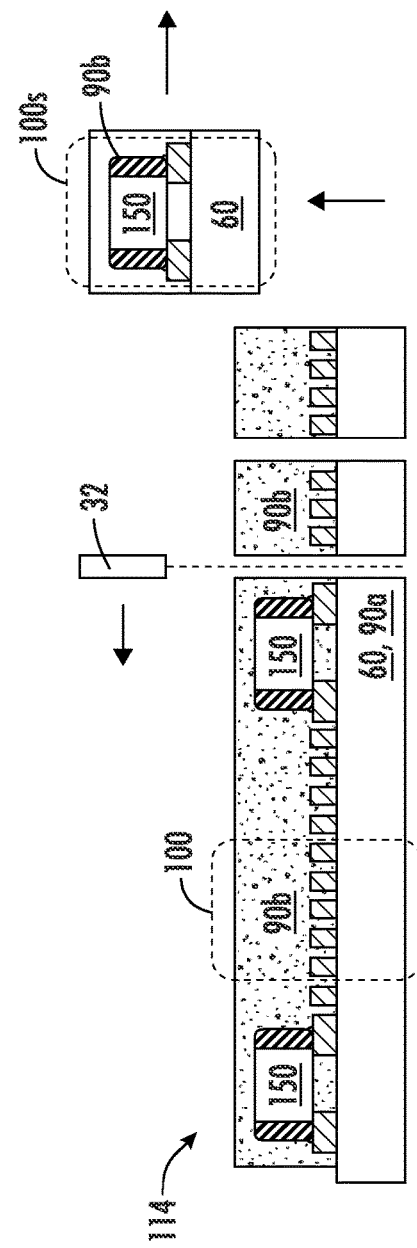

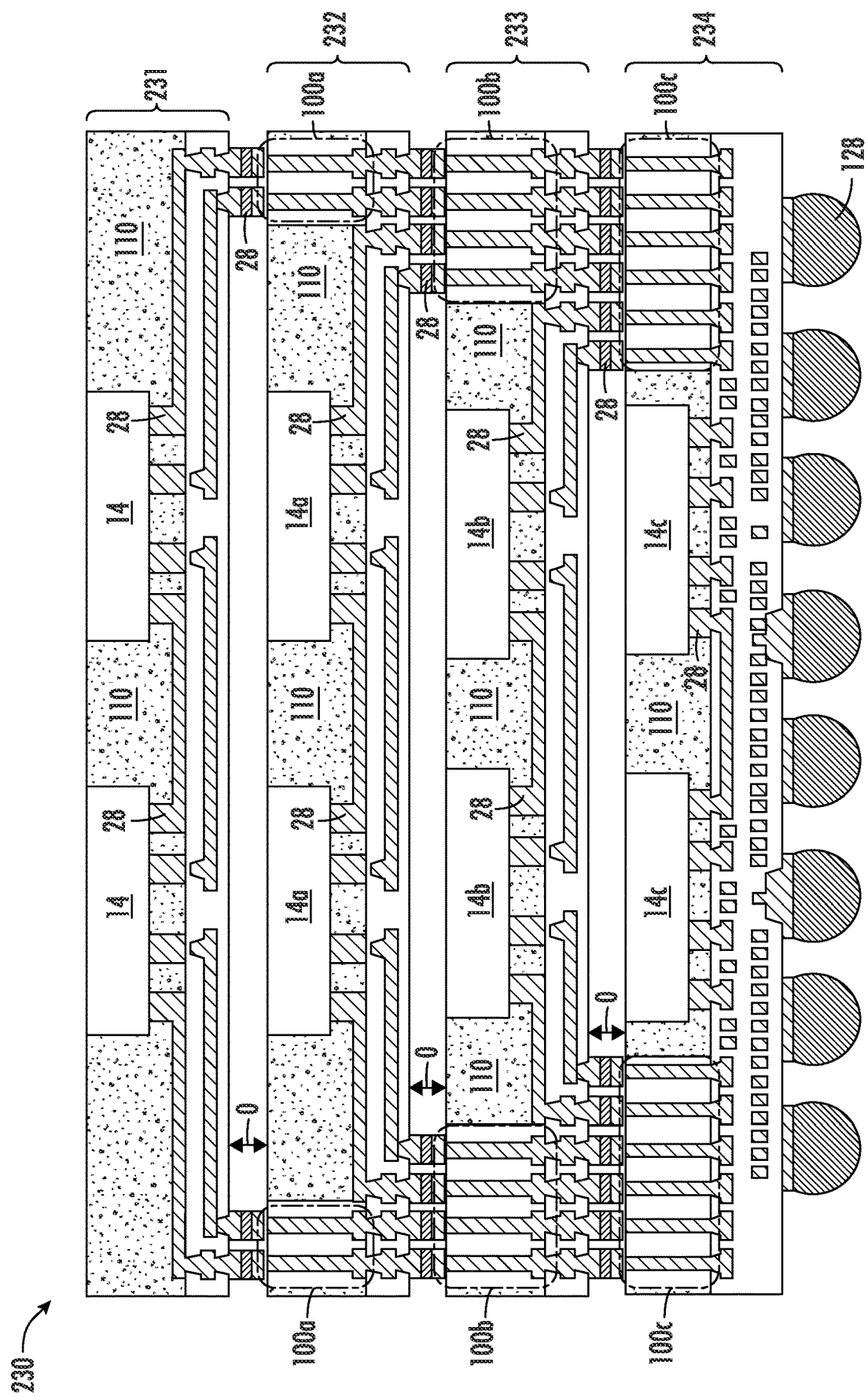

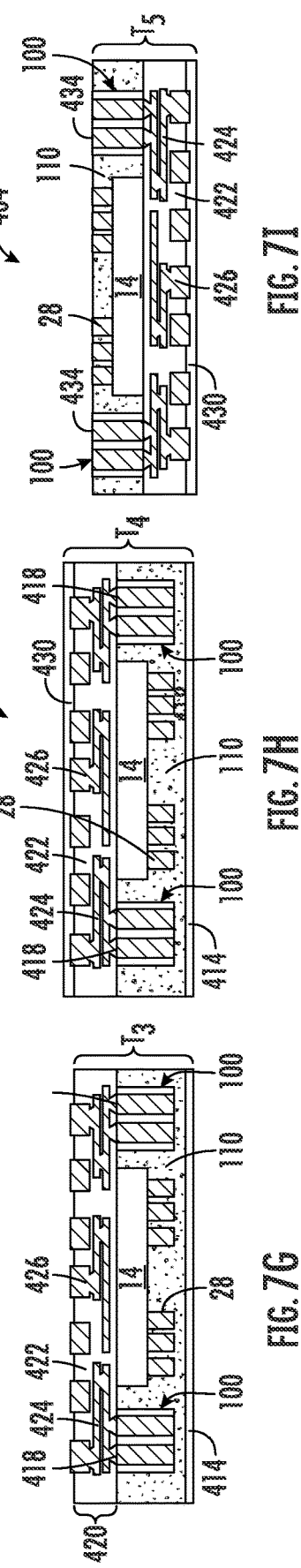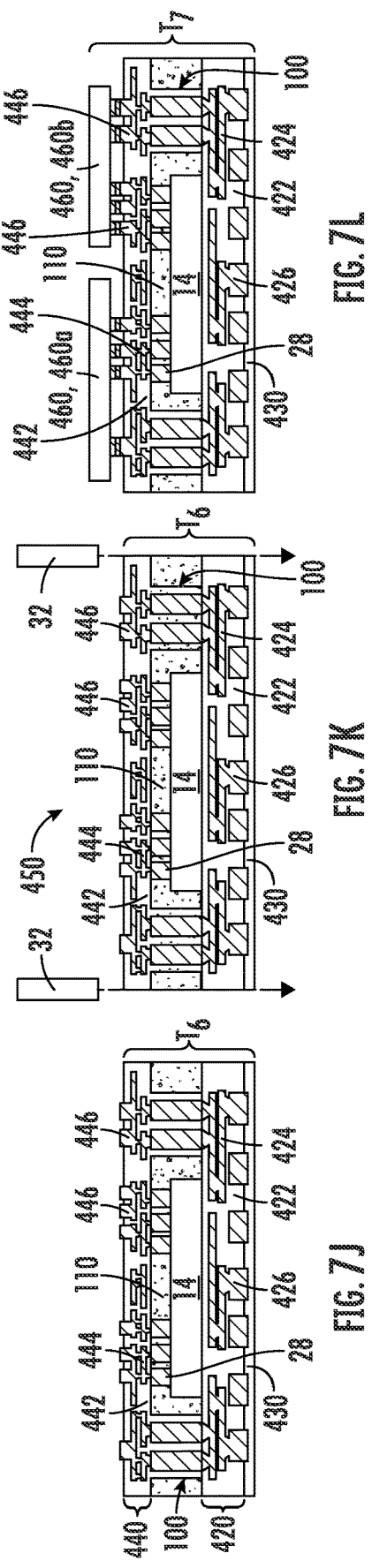

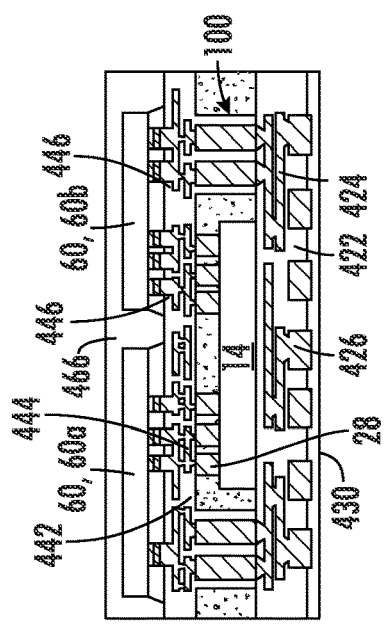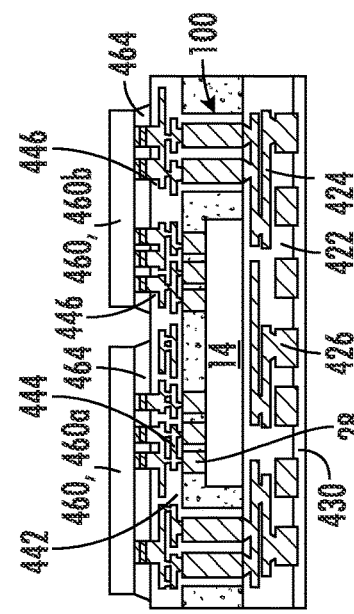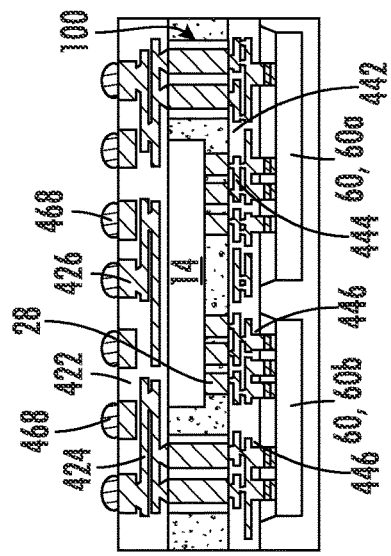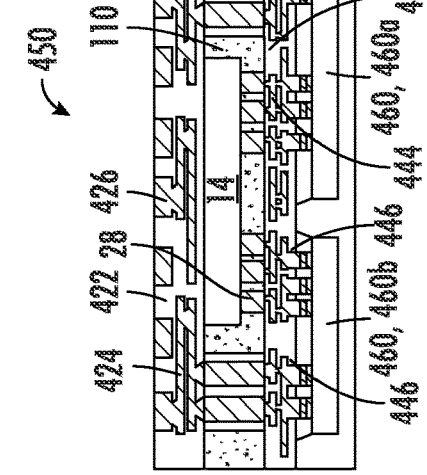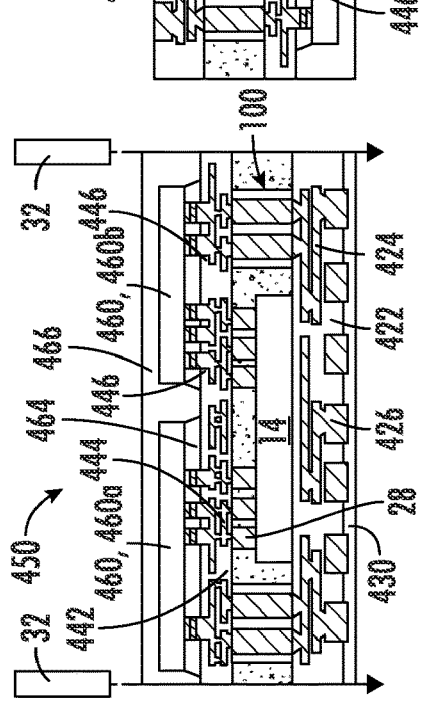

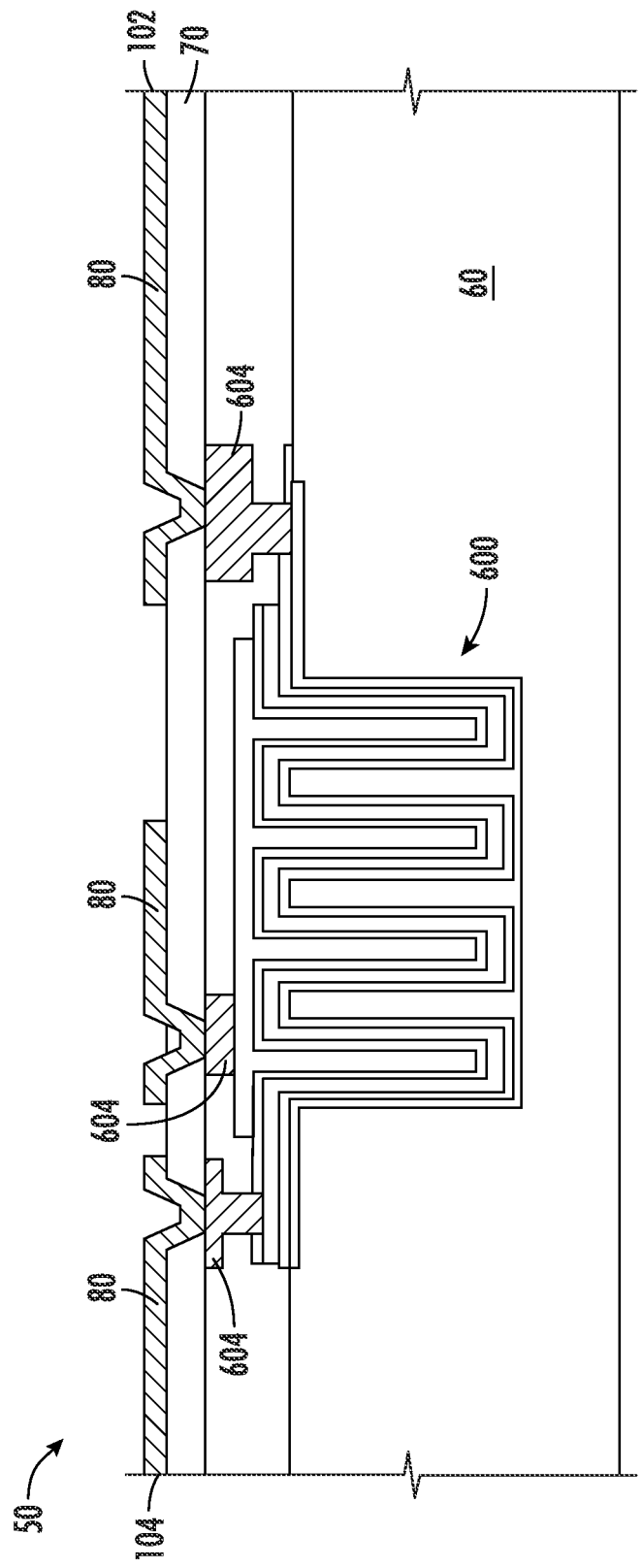

SEMICONDUCTOR ASSEMBLY COMPRISING A 3D BLOCK AND METHOD OF MAKING THE SAME

CROSS-REFERENCE TO RELATED APPLICATIONS

This application claims the benefit of U.S. Provisional Application No. 63/435,185, entitled "Semiconductor Assembly Comprising a 3D Block and Method of Making the Same," which was filed Dec. 23, 2022, the entire disclosure of which is hereby incorporated herein by this reference.

INCORPORATION BY REFERENCE

This disclosure hereby incorporates by reference the entirety of the disclosures of:
(i) U.S. patent application Ser. No. 13/891,006, titled "Semiconductor Device and Method of Adaptive Patterning for Panelized Packaging," filed May 9, 2013, and issued as U.S. Pat. No. 9,196,509;
(ii) U.S. patent application Ser. No. 13/893,117, titled "Adaptive Patterning for Panelized Packaging," filed May 13, 2013, and issued as U.S. Pat. No. 8,826,221;
(iii) U.S. Provisional Patent Ser. No. 62/154,218, entitled "3D Interconnect Component for Fully Molded Packages," which was filed on Apr. 29, 2015; and (iv) U.S. Non-Provisional patent Ser. No. 15/141,028, entitled "3D Interconnect Component for Fully Molded Packages," which was filed on Apr. 28, 2016 and issued Nov. 22, 2016 as U.S. Pat. No. 9,502,397.

TECHNICAL FIELD

Embodiments of the present disclosure relate to the field of electronic assemblies, electronic packages, semiconductor assemblies, and semiconductor packages that comprise three-dimensional (3D) block and method of making the same.

BACKGROUND

Semiconductor assemblies and packages are commonly found in modern electronic products. Semiconductor assemblies vary in the number and density of electrical components and include both passive and active devices, including semiconductor chips or semiconductor die. Discrete devices generally contain one type of electrical component, for example, discrete semiconductor devices comprise light emitting diodes (LEDs), small signal transistors, and power metal oxide semiconductor field effect transistors (MOSFET), while discrete passive devices comprise resistors, capacitors, and inductors. Integrated semiconductor devices typically contain hundreds to millions of electrical components. Examples of integrated semiconductor devices include microcontrollers, microprocessors, optical devices, charged-coupled devices (CCDs), solar cells, and digital micro-mirror devices (DMDs).

Semiconductor devices perform a wide range of functions such as signal processing, high-speed calculations, transmitting and receiving electromagnetic signals, optical signals, or both, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor assemblies and semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device, such as a chip or semiconductor die contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, that is, a wafer fabrication manufacturing process, and packaging manufacturing process, each involving potentially hundreds of steps. Wafer fabrication manufacturing involves the formation of transistors in a front-end of line (FEOL) process, such as forming plurality of semiconductor die on the surface of a semiconductor wafer, and then interconnect and dielectric processes through to passivation in back-end of line (BEOL) process. Each semiconductor die is typically identical and contains circuits formed by electrically connecting active and passive components. The packaging manufacturing process involves singulating individual semiconductor die from the finished wafer and packaging the die to provide structural support and environmental isolation. The term "semiconductor die" as used herein refers to both the singular and plural form of the words, and accordingly can refer to both a single semiconductor device and multiple semiconductor devices.

One goal of semiconductor manufacturing and packaging of semiconductor assemblies is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. The packaging manufacturing process may result in semiconductor device packages with a smaller footprint by improvements in electrical interconnection and packaging materials.

SUMMARY

In some aspects, the disclosure concerns a method of making an assembly or package, comprising providing a first carrier, and forming a conductive element horizontally oriented over the first carrier. The conductive element comprises conductive traces. Support material is formed around the conductive element. The conductive element and the support material are singulated to form a plurality of 3D blocks without surface mount devices and removing the 3D blocks from the first carrier. A second carrier is provided.

Each of the plurality of 3D blocks is rotated and mounted over the second carrier with the conductive traces of the 3D blocks vertically oriented to form a vertically oriented conductive element. The vertically oriented conductive element may comprise a conductive barrier layer disposed along a surface of the vertically oriented conductive trace. A plurality of components may be disposed over the second carrier and disposed laterally offset from each of the plurality of 3D blocks. Encapsulant may be disposed over the second carrier and around the plurality of 3D blocks and around the plurality of components to form a reconstituted panel. A first interconnect structure may be formed over a first surface of the reconstituted panel and coupled with first ends of the conductive traces of the vertically oriented conductive element and coupled with conductive contacts on the components. The reconstituted panel and first interconnect structure may be singulated to form a plurality of individual assemblies.

In some instances, the first carrier, the second carrier, or both may comprise one or more of a permanent or temporary carrier formed of metal, glass, silicon, semiconductor material, and mold compound. The first carrier may comprise a permanent wafer that is singulated with the conductive element and the support material to form a portion of the plurality of 3D blocks, wherein the wafer comprises an active semiconductor device, passive device, circuit, or integrated circuit (IC) that is part of the plurality of 3D blocks. The conductive element may further comprises, or be coupled to, at least a portion of one or more of a capacitor, inductor, shielding, resistor, antenna or antenna feed, voltage regulator, an electrostatic discharge (ESD) protection circuit, a clock or timing circuit, a passive devices for RF tuning, micro lasers, Power Management IC's (PMICs), Integrated Passive Devices (IPDs), Deep Trench Capacitors (DTCs), decoupling capacitors, switches, memory including cache memory, and face down chips. The conductive traces may be formed as one or more of: medium-density traces with a pitch less than or equal to 100 micrometers (μm), high-density traces with a pitch less than or equal to 50 μm, and as ultra high-density traces with a pitch less than or equal to 20 μm. The support material may comprise one or more layers of mold compound, polymer material, or dielectric material. A stack of components may coupled with at least one of the plurality of components. The component may be coupled to one or more of a processor, memory, analog circuit, RF circuit, SMDs, MEMs, sensor, optoelectronic, or heat sink. The second interconnect structure may be formed as a build-up interconnect structure over a second surface of the reconstituted panel opposite the first surface of the reconstituted panel, the second interconnect structure coupled with second ends of the conductive traces. The first interconnect structure may be formed with unit specific patterning.

Other aspects of the disclosure include a method of making an assembly or package, comprising forming a 3D block comprising a built-up conductive element coupled with a support material. The conductive element is formed in a horizontal orientation. The method includes rotating the 3D block so the conductive element is disposed in a vertical orientation. The support material is disposed at least partially around the conductive element, and the assembly or package comprises the 3D block.

In some instances, the assembly or package may be formed without using a glass carrier. The vertically oriented conductive element may comprise a barrier layer disposed at a lateral surface of the vertically oriented conductive element. The support material may be cut to form the 3D block with a cut edge. The conductive traces may be formed with first ends exposed with respect to an encapsulant disposed around the 3D block. The conductive element may further comprise, or be coupled to, at least a portion of one or more of a capacitor, inductor, shielding, resistor, antenna or antenna feed, voltage regulator, an ESD protection circuit, a clock or timing circuit, a passive devices for RF tuning, micro lasers, PMICs, IPDs, DTCs, decoupling capacitors, switches, memory including cache memory, and face down chips. The 3D block may be rotated so the conductive element is disposed in a vertical orientation and comprises conductive traces formed as one or more of: medium-density traces with a pitch less than or equal to 100 μm, high-density traces with a pitch less than or equal to 50 μm, and as ultra high-density traces with a pitch less than or equal to 20 μm. The support material comprises one or more layers of mold compound, polymer material, or dielectric material. A stack of components may be coupled with at least one of the plurality of components. The 3D block may be formed with a wave guide comprising optical properties. The 3D block may be formed as a molded block, wherein ends of the molded block and the vertical interconnect are exposed by grinding. The 3D conductive elements may extend through an entire height of the assembly or package. The electrically conductive layer may extend to the 3D conductive elements may be formed using unit specific patterning.

Other aspects of the disclosure include an assembly or package, comprising one or more 3D conductive elements coupled to support material and extending through the assembly. The 3D conductive elements may further comprise a first exposed end and a second exposed end that are uncovered with respect to the support material. The support material may comprise a cut or ground edge. The 3D conductive elements comprise a barrier layer coupled along a surface of the conductive elements that extend between the first exposed end and the second exposed end.

In some instances of the assembly or package, the conductive elements may comprise conductive traces comprising one or more of: medium-density traces with a pitch less than or equal to 100 micrometers (μm), high-density traces with a pitch less than or equal to 50 μm, and as ultra high-density traces with a pitch less than or equal to 20 μm. The 3D conductive elements may extend through an entire height of the assembly or package. A first build-up interconnect structure may be formed over and coupled with the first exposed ends of the conductive elements. A second build-up interconnect structure may be formed over and coupled with the second exposed ends of the conductive elements, wherein the second ends of the conductive elements are opposite the first ends of the conductive elements. The conductive element may further comprise, or be coupled to, at least a portion of one or more of a capacitor, inductor, shielding, resistor, antenna or antenna feed, voltage regulator, an ESD protection circuit, a clock or timing circuit, a passive devices for RF tuning, micro lasers, PMICs, IPDs, DTCs, decoupling capacitors, switches, fuses, memory including cache memory, and face down chips. The support material may comprise one or more layers of mold compound, polymer material, or dielectric material. A component may be disposed adjacent the conductive elements, and a stack of components may be coupled with the component.

The foregoing and other aspects, features, applications, and advantages will be apparent to those of ordinary skill in the art from the specification, drawings, and the claims. Unless specifically noted, it is intended that the words and phrases in the specification and the claims be given their plain, ordinary, and accustomed meaning to those of ordinary skill in the applicable arts. The inventors are fully aware that they can be their own lexicographer if desired. The inventors expressly elect, as their own lexicographers, to use only the plain and ordinary meaning of terms in the specification and claims unless they clearly state otherwise and then further, expressly set forth the "special" definition of that term and explain how it differs from the plain and ordinary meaning. Absent such clear statements of intent to apply a "special" definition, it is the inventors' intent and desire that the simple, plain and ordinary meaning to the terms be applied to the interpretation of the specification and claims.

The inventors are also aware of the normal precepts of English grammar. Thus, if a noun, term, or phrase is intended to be further characterized, specified, or narrowed in some way, then such noun, term, or phrase will expressly include additional adjectives, descriptive terms, or other modifiers in accordance with the normal precepts of English grammar. Absent the use of such adjectives, descriptive terms, or modifiers, it is the intent that such nouns, terms, or phrases be given their plain, and ordinary English meaning to those skilled in the applicable arts as set forth above.

Further, the inventors are fully informed of the standards and application of the special provisions of 35 U.S.C. § 112(f). Thus, the use of the words "function," "means" or "step" in the Detailed Description or Description of the Drawings or claims is not intended to somehow indicate a desire to invoke the special provisions of 35 U.S.C. § 112(f), to define the invention. To the contrary, if the provisions of 35 U.S.C. § 112(f) are sought to be invoked to define the inventions, the claims will specifically and expressly state the exact phrases "means for" or "step for", and will also recite the word "function" (i.e., will state "means for performing the function of [insert function]"), without also reciting in such phrases any structure, material or act in support of the function. Thus, even when the claims recite a "means for performing the function of . . . " or "step for performing the function of . . . ," if the claims also recite any structure, material or acts in support of that means or step, or that perform the recited function, then it is the clear intention of the inventors not to invoke the provisions of 35 U.S.C. § 112(f). Moreover, even if the provisions of 35 U.S.C. § 112(f) are invoked to define the claimed aspects, it is intended that these aspects not be limited only to the specific structure, material or acts that are described in the preferred embodiments, but in addition, include any and all structures, materials or acts that perform the claimed function as described in alternative embodiments or forms of the disclosure, or that are well known present or later-developed, equivalent structures, material or acts for performing the claimed function.

BRIEF DESCRIPTION OF THE DRAWINGS

FIGS. 1A-1E illustrate various views of components, chips, or semiconductor die.

FIGS. 2A-2I illustrate the formation of 3D blocks being formed with conductive elements, such as conductive layers with a horizontal orientation.

FIGS. 3A-3G illustrate the formation of semiconductor assemblies comprising semiconductor components and the 3D blocks comprising conductive elements, such as conductive layers with a vertical orientation.

FIGS. 4A-4F illustrate another aspect of forming 3D blocks with conductive elements comprising conductive layers formed with a horizontal orientation and further comprising an assembly, surface mount device (SMD), or semiconductor assembly.

FIGS. 6A-6C illustrate stacks of semiconductor assemblies comprising 3D blocks.

FIG. 9 illustrates a wafer comprising and IPD that may be part of a 3D block.

DETAILED DESCRIPTION

Figure 1E:
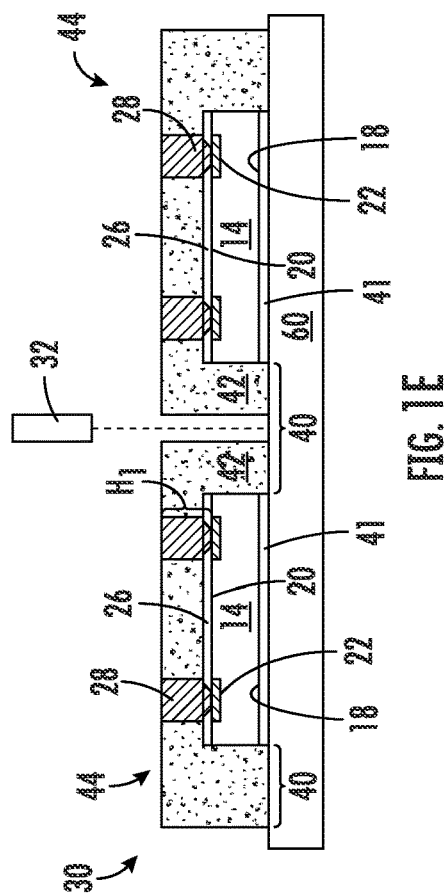

The present disclosure includes one or more aspects or embodiments which are described and illustrated in the following written description with reference to the figures, in which like numerals represent the same or similar elements. A person of ordinary skill in the art (POSA) will appreciate that the description is intended to cover alternatives, modifications, and equivalents as may be included within the spirit and scope of the disclosure as defined by the appended claims and their equivalents as supported by the following disclosure and drawings. In the description, numerous specific details are set forth, such as specific configurations, compositions, and processes, etc., in order to provide a thorough understanding of the disclosure. In other instances, well-known processes and manufacturing techniques have not been described in particular detail in order to not unnecessarily obscure the disclosure. Furthermore, the various embodiments shown in the FIGS. are illustrative representations and are not necessarily drawn to scale.

This disclosure relates to semiconductor assemblies comprising three-dimensional (3D) blocks and methods of making the same, which may provide for vertical electrical interconnection, through package routing, stacking, 3D interconnection, signal propagation or routing for electrical, optical or other desired signal, and for facilitating desired interconnection or routing. The conductive elements or interconnects can be formed very densely on a horizontal plane and then cut and rotated (e.g., orthogonally or about 90 degrees) to result in dense interconnects or 3D interconnects. The dense interconnects or 3D interconnects are much denser than can be formed in a vertical interconnect formation process (because the dense or 3D interconnects have been made in a horizontal or substantially horizontal process and then rotated}. As used herein, "substantially" means the stated amount plus or minus (+ or −) 50% or less, 40% or less, 30% or less, 20% or less, 10% or less, 5% or less, or 1% or less.

This disclosure, its aspects and implementations, are not limited to the specific package types, material types, or other system component examples, or methods disclosed herein. Many additional components, manufacturing and assembly procedures known in the art consistent with semiconductor manufacture and packaging are contemplated for use with particular implementations from this disclosure. Accordingly, for example, although particular implementations are disclosed, such implementations and implementing components may comprise one or more of any components, models, types, materials, versions, quantities, and the like as is known in the art for such systems and implementing components, consistent with the intended operation.

The word "exemplary," "example" or various forms thereof are used herein to mean serving as an example, instance, or illustration. Any aspect or design described herein as "exemplary" or as an "example" is not necessarily to be construed as preferred or advantageous over other aspects or designs. Furthermore, examples are provided solely for purposes of clarity and understanding and are not meant to limit or restrict the disclosed subject matter or relevant portions of this disclosure in any manner. It is to be appreciated that a myriad of additional or alternate examples of varying scope could have been presented but have been omitted for purposes of brevity.

Where the following examples, embodiments and implementations reference examples, it should be understood by those of ordinary skill in the art that other manufacturing devices and examples could be intermixed or substituted with those provided. In places where the description refers to particular embodiments, it should be readily apparent that a number of modifications may be made without departing from the spirit thereof and that these embodiments and implementations may be applied to other technologies as well. Accordingly, the disclosed subject matter is intended to embrace all such alterations, modifications and variations that fall within the spirit and scope of the disclosure and the knowledge of one of ordinary skill in the art.

FIG. 1A illustrates a plan or top view of a substrate 8, which may comprise a semiconductor wafer or native wafer 10 with a base substrate material 12, such as, without limitation, silicon, germanium, gallium arsenide, indium phosphide, or silicon carbide, for structural support. A plurality of chips, semiconductor die, or components 14 can be formed on wafer 10 separated by a non-active, inter-die wafer area or saw street 16. As used herein, the component 14 comprises active devices, passive devices, or both. Components 14 comprise semiconductor components, chips, and semiconductor die. Components 14 further comprise non-semiconductor components such as components that are non-active, or are formed without transistors. Components 14 comprise sensors and Microelectromechanical systems (MEMS) that do not rely on a semiconductor materials for making transistors. Components 14 also comprise discrete passives such as resistors or capacitors, other semiconductor die, ICs, bridge die, wafer level chip scale packages (WLCSPs), MEMs and any other suitable component. For purposes of illustration, a non-limiting example of the component 14 being a chip or semiconductor die is described in FIGS. 1A-1D. Accordingly, the saw street 16 can provide cutting areas to singulate the semiconductor wafer 10 into the individual components or chips 14 that become embedded devices can be formed on a substrate 8 formed of glass, ceramic, or other suitable material for providing structural support for subsequent processing.

Each component 14 may comprise one or more active devices, passive devices, or both active devices and passive devices. In some instances, the component 14 may be formed without active and passive devices, and be used for transmission or routing, such as by comprising TSVs for vertical interconnect. For example, the component 14 may be formed as a bridge chip with only electrical routing and with copper studs of the semiconductor chip electrically connected or coupled with wiring, routing, or RDL. The component 14 may also be only a dummy substrate with no electrical function, but rather act as structural element and may or may not include copper studs.

The component 14 comprises semiconductor chips and semiconductor die that comprise a backside or back surface 18 and may comprise an active layer 20 opposite the backside 18. The active layer contains one or more analog, or digital circuits implemented as active devices, conductive layers, and dielectric layers formed within or on the chip and electrically interconnected according to the electrical design and function of the semiconductor chip. In some instances, passive devices may also be integrated as part of the semiconductor chip or semiconductor die. The component 14 may comprise circuits that may include one or more transistors, diodes, and other circuit elements formed within the active layer to implement analog circuits or digital circuits, such as DSP, ASIC, memory, or other signal processing circuits. Digital circuits may include RF circuits, LED, LCOS, CIS, transistor, optoelectronic, MEMS and the like. The component 14 may also contain IPDs such as inductors, capacitors, and resistors, for RF signal processing, digital power line control or other functions. The component 14 may be formed on a native wafer. In some instances, a wafer level process may be used to produce many packages simultaneously on a carrier. In other instances, the package may be formed as part of a reconstituted wafer and may comprise multiple components or chips molded together.

FIG. 1B illustrates a cross-sectional view of a portion of semiconductor wafer 10 shown taken along the section line 1B in FIG. 1A. Each component 14 is shown comprising a backside or back surface 18 and an active layer 20 opposite the backside.

An electrically conductive layer or contact pads 22 is formed over active layer 20 using PVD, CVD, electrolytic plating, electroless plating process, or other suitable metal deposition process. Conductive layer 22 can be one or more layers of aluminum (Al), Titanium (Ti), copper (Cu), tin (Sn), nickel (Ni), gold (Au), palladium (Pd), silver (Ag), cobalt (Co), platinum (Pt), or other suitable electrically conductive material. Conductive layer 22 operates as contact pads or bond pads electrically coupled or connected to the circuits on active layer 20. Conductive layer 22 can be formed as contact pads disposed side-by-side a first distance from an edge 24 of component 14, as shown in FIG. 1B. Alternatively, conductive layer 22 can be formed as contact pads that are offset in multiple rows such that a first row of contact pads is disposed a first distance from the edge 24 of the component 14, and a second row of contact pads alternating with the first row is disposed a second distance from the edge 24 of the component 14. In other instances, the component 14 can comprise digital chips, analog chips, or RF chips (or other chips) with more than two rows of bond pads and may further comprise bond pads 22 over the whole surface of the chip that do not follow a full grid pattern. Other components 14 may have bond pads in an array over the whole surface of the chip.

FIG. 1B also illustrates the semiconductor substrate 10 and components 14 can undergo an optional grinding operation with grinder 29 to reduce a thickness of the semiconductor substrate 10 and component 14. In some cases, a wet etch or plasma etching process may be used to reduce the thickness of the semiconductor substrate 10 and component 14.

FIG. 1B further shows one or more optional insulating, passivating, or dielectric layer 26 may be conformally applied over active layer 20 and over conductive layer 22. Insulating layer 26 can include one or more layers that are applied using PVD, CVD, screen printing, spin coating, spray coating, sintering, thermal oxidation, or other suitable process. Insulating layer 26 can contain, without limitation, one or more layers of silicon dioxide ($SiO_2$), silicon nitride ($Si_3N_4$), silicon oxynitride (SiON), tantalum pentoxide ($Ta_2O_5$), aluminum oxide ($Al_2O_3$), polymer, polyimide, Carbon-Doped Oxide (CDO), benzocyclobutene (BCB), polybenzoxazoles (PBO), or other material having suitable insulating and structural properties. Alternatively, components 14 are packaged without the use of insulating layer 26. In another embodiment, insulating layer 26 includes a passivation layer formed over active layer 20 without being disposed over conductive layer 22. When insulating layer 26 is present and formed over conductive layer 22, openings are formed completely through insulating layer 26 to expose at least a portion of conductive layer 22 for subsequent mechanical and electrical interconnection. Alternatively, when insulating layer 26 is omitted, conductive layer 22 is exposed for subsequent electrical interconnection without the formation of openings.

FIG. 1B shows conductive studs or electrical interconnect structures 28 can be formed as conductive studs, bumps, thick pads, columns, pillars, posts, or conductive studs and are disposed over, and coupled or connected to, contact pads 22. The conductive studs 28 can be formed directly on contact pads 22 using patterning and metal deposition processes such as printing, PVD, CVD, sputtering, electrolytic plating, electroless plating, evaporation, or other suitable metal deposition process. Alternately, conductive studs 28 may be formed in a position not vertically over the pads 22 and connected by RDL. Conductive studs 28 can be one or more layers of Al, Cu, Sn, Ni, Au, Ag, palladium (Pd), or other suitable electrically conductive material and can include one or more UBM layers. In an embodiment, a photoresist layer can be deposited over component 14 and contact pads 22. A portion of the photoresist layer can be exposed and removed by a developing or other suitable process. Electrically conductive studs 28 can then be formed as pillars or other structures as previously described in the removed portion of the photoresist and over contact pads 22 using a plating process. In some embodiments, copper may be used in a plating process. The photoresist layer and other appropriate layers, such as the seed layer, can be removed leaving conductive studs 28 that provide for subsequent mechanical and electrical interconnection and a standoff with respect to active layer 20 and insulating layer 26 if present. In some instances, the conductive studs 28 include a height $H_1$ in a range of 10-100 µm, 5-50 µm, or about 25 µm.

A conductive stud is a conductive interconnect structure that may have generally vertical sides and may be wider than it is tall, built-up on a substrate, such as over an active surface of a chip, polyimide, or mold compound. A conductive stud, though typically formed of the same materials as a pillar or post would be formed, may differ from a pillar or post, each of which may have a height greater than its width. A conductive stud, though it is commonly formed in a cylindrical shape, may be formed with a cross-sectional area that is circular, oval, octagonal, or as any polygonal or other shape and size. Another use for a conductive stud is as a dummy thermal conductive stud that is not electrically coupled to an active electrical circuit but is instead thermally coupled to a heat source of an active device to conduct or dissipate the heat to another structure, such as to a die pad on a surface of the component 14. The generally vertical sides of a conductive stud 28 are different from the sides shape that exists for a solder ball or a compressed or outwardly deformed solder ball that has generally rounded sides. The generally vertical nature of a conductive stud 28 comes from being formed in a structure that has been previously developed or etched, such as within openings in a photoresist layer, which will also be generally vertical, although it may comprise imperfections or irregularities in shape that result from the etching process, the photoresist material, or other materials and processes used. For example, developing or etching does not generally perfectly or uniformly remove the photoresist within the openings, and therefore forms imperfect, generally vertical openings for deposition of conductive materials for the conductive stud 28. The term "generally vertical" as used herein includes perfectly vertical and imperfectly vertical sides. A conductive stud is not a wire bond and is not solder.

FIG. 1C, further illustrates an instance in which one or more of an optional adhesive or a die attach film (DAF) 41 or conductive material 30 may be attached to the back surface 18 of the component 14, such as for subsequent mounting on a carrier. FIG. 2C also illustrates wafer 10 can be singulated with a saw or wafer cutting tool 32 into individual components 14 through saw streets 16 using a saw blade, laser cutting tool, plasma, or a scribe and break process. In some instances, the components 14 will have a thickness (shown in the vertical direction, bottom to top, of the page) of between about 25 µm to about 150 µm for thin ground wafers, or about 100 µm to about 800 µm for thick ground wafers.

Figure 1D:
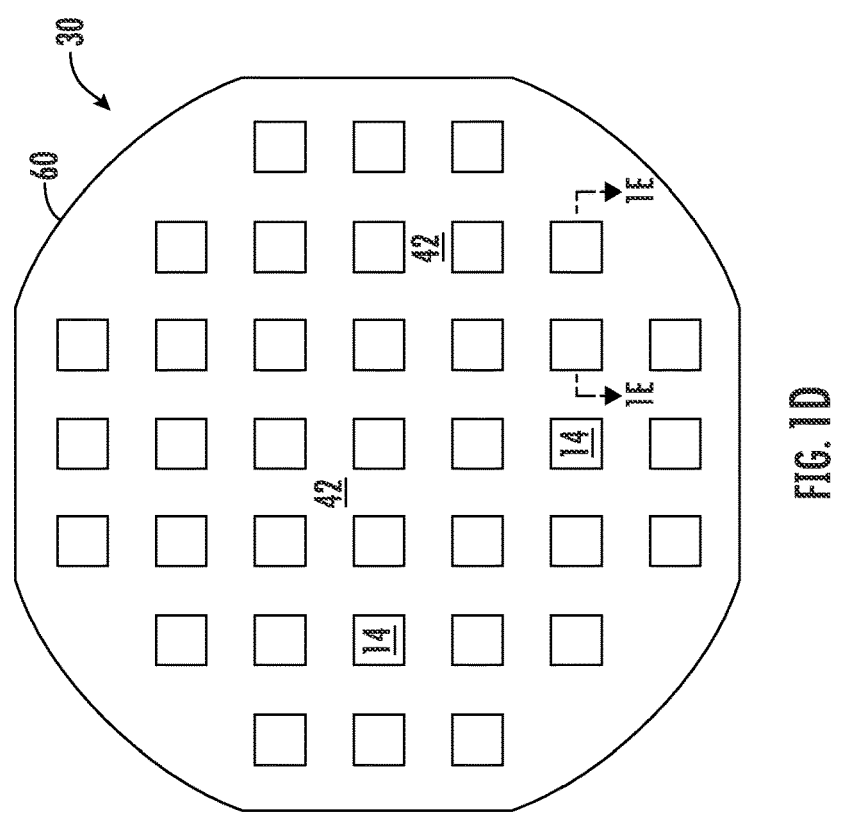

FIG. 1D, as well as FIGS. 2A-4F and FIGS. 7A-7T, further illustrates various carriers or substrates 60, that comprises one or more of permanent or temporary carrier formed of metal, glass, silicon, semiconductor material, mold compound, or other suitable material. The carrier 60, including a first carrier 60a, a second carrier 60b, a third carrier 60c, or any number of carrier, may comprise a panel, a temporary carrier, a reusable carrier, a sacrificial carrier, a wafer, or a substrate. The carrier 60 may be made of or comprise one or more of metal, glass, silicon, mold compound, or other suitable material, with or without a release layer. The carrier 60 may comprise a form factor or footprint of a wafer (circular footprint), a panel (square or rectangle), or of any suitable shape and may comprise a diameter or width of 200-600 mm, such as 300 mm, or of any other suitable size.

As illustrated in FIG. 1D, components 14 may be disposed over temporary carrier 60 using a pick and place operation, or in any other suitable way. An encapsulant 42 can be deposited around the components 14, including over at least 5 sides of components 14, such as around 4 sides surfaces and over a surface or active layer 20 or over a backside 18. The encapsulant 42 can be deposited around the plurality of components 14 using a paste printing, compression molding, transfer molding, liquid encapsulant molding, lamination, vacuum lamination, spin coating, or other suitable application method. The encapsulant 42 can be a polymer composite material, such as epoxy resin with filler commonly referred to as molding compound, epoxy acrylate with filler, or other polymer with proper filler. Components 14 can be embedded together in encapsulant 42, which can be non-conductive and environmentally protect the components 14 from external elements and contaminants.

The orientation of components 14, can be either face up with active layer 20 oriented away from carrier 60 to which the chips 14 are mounted, or alternatively can be mounted face down with active layer 20 oriented toward the carrier 60 to which the chips 14 are mounted. Accordingly, an adhesive 41 (see, e.g., FIG. 1C) can be included or omitted from over back surface 18 of components 14, depending on the process used for encapsulating the components 14 and forming a panel or reconstituted panel 30 comprising components 14 fully molded in a core of encapsulant 42 or within an epoxy core.

The panel 30 can optionally undergo a curing process to cure encapsulant 42. A surface of encapsulant 42 can be substantially coplanar with adhesive 41. Alternatively, encapsulant 42 can be substantially coplanar with backside 18, the encapsulant being exposed by the removal of carrier and interface layer. The panel 30 can include a footprint or form factor of any shape and size including circular, rectangular, or square, such as a form factor in a range of 200-600 millimeters (mm), including that of a semiconductor wafer including a circular footprint having a diameter of 300 mm. Any other desirable size can also be formed.

FIG. 1E, illustrates a cross-sectional view of an instance in which the components 14 are formed as embedded components or embedded semiconductor devices 44. The embedded components 44 can be disposed over a temporary carrier, a reusable carrier, a sacrificial carrier, or any suitable carrier 60, made of metal, glass, silicon, mold compound, or other suitable material, with a release layer. The carrier 60 may comprise a form factor or footprint of a wafer (circular footprint), a panel (square or rectangle), or of any suitable shape and may comprise a diameter or width of 200-600 mm, such as 300 mm, or of any other suitable size. The embedded components 44 can be separated by being singulated through gaps or saw streets 40 using a saw blade, grinding wheel, plasma cutting tool, laser cutting or other suitable tool 32 into individual embedded components or embedded semiconductor devices 44 which may be interchangeably used with components 14 in any of the subsequent FIGS. and explanations. The embedded components 44 can then be used as part of a subsequently formed assembly or package as discussed in greater detail below. However, the embedded component 44 comprising a chip or semiconductor die or other component 14 can also be fully testable after conductive studs 28 are applied and before the embedded components 44 are singulated from a panel, or assembled into another structure.

In some instances, the embedded semiconductor die 44 can be formed as described in U.S. patent application Ser. No. 13/632,062, now U.S. Pat. No. 8,535,978, entitled "Die Up Fully Molded Fan-out Wafer Level Packaging," which was filed on Apr. 29, 2015, the entirety of the disclosure of which is incorporated herein by this reference.

FIGS. 2A-2I illustrate the formation of 3D (molded) blocks, 3D interconnect components, or 3D conductive elements 100 being formed with conductive elements or conductive layers 80, such as conductive layers with a horizontal orientation. While the term "block" is use herein with respect to 3D blocks 100, the term "block" may be non-limiting and is used for ease of description. The 3D blocks 100 may comprise curved, arced, or non-angular sides and faces and as such the term "block" refers to more than just a geometric form, and further denotes a reference to a unit, object, or form generally.

FIG. 2A illustrates providing a carrier or substrate 60 or first carrier or substrate 60a, and forming the conductive element 80 horizontally oriented over the carrier 60. The carrier 60 can be a permanent carrier, a temporary carrier, a reusable carrier, a sacrificial carrier, or any suitable carrier, and may comprise a substrate, laminate layer, printed circuit board (PCB), or blank mold compound panel, as well as a carrier or substrate made of glass, silicon, mold compound, or other suitable material, and may include a release layer. The carrier 60 may comprise a permanent silicon wafer (or wafer of other suitable semiconductor material) that is singulated with the conductive element 80 and the support material 70 to form a portion of the plurality of 3D blocks 100, wherein the silicon wafer comprises an active semiconductor device, circuit, or integrated circuit (IC) that is part of the plurality of 3D blocks 100.

The carrier 60 may also be a molded carrier or plastic mold compound wafer, which can include filler, such as silica filler or other suitable filler. The carrier 60 may comprise a form factor or footprint of a wafer (circular footprint) or panel (square or rectangle) and may comprise a diameter or width of 200-600 mm, such as 300 mm, or of any other suitable size. As used herein a "permanent" carrier or substrate 60 is one from which at least a portion of the permanent carrier 60 (such as after thinning or grinding) is incorporated into a final assembly. As used herein a "temporary" carrier or substrate 60 is one that is used during processing or formation of the final assembly but is not incorporated into, and does not become a part of, the final assembly.

The conductive element 80 may be formed over the carrier 60. The conductive element 80 may be first formed horizontally, then moved to a vertical orientation (as shown in FIGS. 2I and 3A). In some instances, the conductive element 80 may comprise conductive routing, traces, or vias, of different thicknesses. The conductive element 80 may comprise one or more features, including traces 86, land pads, capacitors, inductors, shielding, resistors, antenna or antenna feed, voltage regulator, an ESD protection circuit, a clock or timing circuit, or a passive devices for RF tuning, or other similar or useful feature or structure, including optical structures, wave guides, and lasers. In some instances, the conductive element 80 can be formed as one or more traces, redistribution layers (RDL) or RDL patterns 86, that can be formed on or over the first surface 66 of the carrier 60. When the 3D block 100 comprises a wave guide or other feature comprising optical properties, then organic material, epoxy, other suitable material, or material that is clear and transmits light or optical signals may be used. In instances where standard interconnects can be built horizontally with current technology but cannot be built vertically with current technology (or in a cost-effective way), the present disclosure provides an opportunity to build the structure horizontally in the known way, and then after the structure has been built (horizontally) to implement and use the feature in a vertical way as part of a 3D block 100.

As used herein, "horizontally" and "vertically" include a range of angles and refer to a general orientation during manufacturing. When the conductive element is manufactured "horizontally," this includes uneven and non-planar topographies, such as shapes and features that may curve and bend. Further, a POSA will appreciate that the pieces, once formed, may be rotated or moved while in use in their final state. Examples of technology that may be included in the 3D block 100 (with—or as part of—the conductive element 80) comprise non-SMDs, micro lasers (such as those built in a wafer fab), voltage regulators, PMICs, IPDs, ESD circuits, timing or clock circuits, DTCs, decoupling capacitors, switches, cache or other memory and face down chips in blocks.

The conductive element 80 can be one or more layers of Al, Cu, Sn, Ni, Au, Ag, Ti, Cu, W, Co, Ta, In, Pd, Pt or a coupling agent, copper, or other suitable electrically conductive material. The conductive element 80 can be formed using PVD, CVD, electrolytic plating, electroless plating, or other suitable process. In an embodiment, the conductive element 80 can comprise a Ti diffusion barrier layer or barrier layer 82, a Cu seed layer 84, and a conductive layer or Cu layer 86 formed over the barrier layer 82 and the Cu seed layer 84. Typically, the barrier layer 82 and seed layer 84 are deposited by a PVD process, such as sputtering. In addition to providing good adhesion to the underlying material it is deposited on, the barrier layer 82 and seed layer 84 provide a plating bus that can enable electrolytic plating of a conductor (such as a plated conductive element) over the seed layer.

FIG. 2B, illustrates a close-up view of the portion of FIG. 2A taken along detail mark 2B, in which one or both of: (i) a barrier layer, adhesion layer, or both 82 (hereinafter "barrier layer"), and (ii) a seed layer 84 are formed as a horizontal structure before the conductive element 80 is plated or formed over the barrier layer 82, the seed layer 84, or both. The conductive element 80 is formed comprising one or more conductive layers 86. Conductive elements 80, including conductive layer 86, are formed according to the current method may be detected in a final 3D block, assembly, or semiconductor assembly 100 after having been moved to a vertical orientation (as shown in FIGS. 2I and 3A). As used herein the directions of horizontal and vertical are made with reference to the orientation of the conductive element 80, which comprises the barrier layer 82 and the seed layer 84, or both, in the final or later structure. In practice, the seed layer 84, because it is very thin and typically the same material as the plated conductive element 80 (including e.g., an electroplated trace layer 86) requires sophisticated techniques such as transmission electron microscopy (TEM) to detect its presence in a final product. It is much easier to detect the barrier or adhesion layer 82 than the seed layer because the barrier or adhesion layer 82 is a different material from the conductive layer or trace layer 86.

The conductive element 80 (including conductive layers or traces 86) may be formed as part of an additive process on, and be in direct contact with, the seed layer 84, which may in turn may be formed on and be in direct contact with the barrier or adhesion layer 82, which may in turn may be formed on and be in direct contact with the support material 70, which may comprise one or more of a dielectric, polymer, insulating layer, or encapsulant below the conductive element 80 (with respect to its formation in the horizontal alignment as shown in FIG. 2B). In other words, a quad-layer structure, "sandwich," or stack from bottom to top (as shown below in FIG. 2B) comprises support material 70 (comprising an optional dielectric layer 74), a barrier or adhesion layer 82 (e.g., Ti), a seed layer 84 (e.g., Cu) and conductive element or layer 86 (e.g., electroplated Cu). A POSA will appreciate that the structure shown in FIG. 2B is also present with respect to the structure shown in the other FIGS., even when the barrier layer and seed layer are omitted from the other figures for simplicity and due to scale.

Figure 3C:
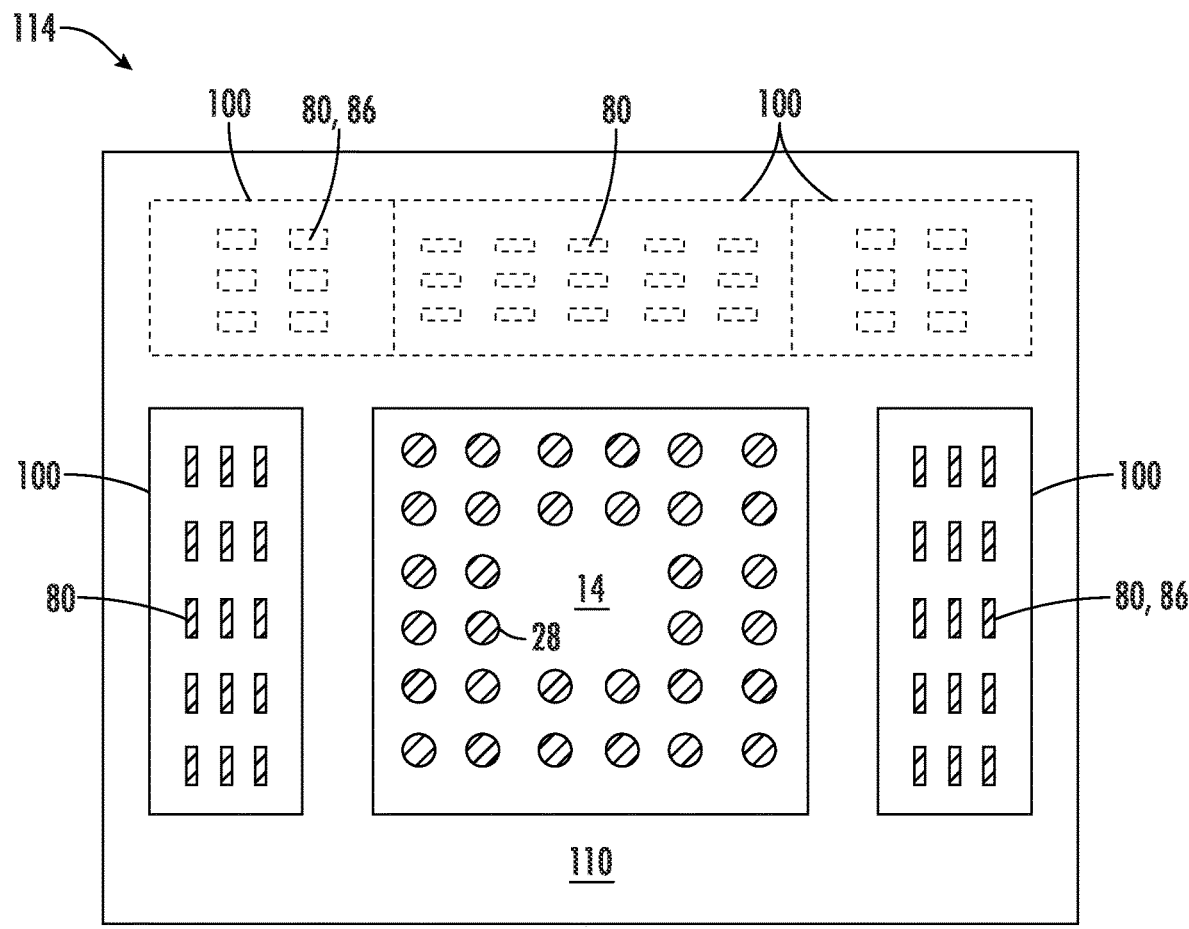

The same conductive elements 80 shown in FIG. 2B may also be disposed adjacent other similar structures 80, as shown with the side-by-side arrangement of a plurality of conductive elements 80, conductive layers 86 illustrated in FIG. 2B. FIG. 3Cp also illustrates a plan view, in which multiple conductive elements 80 are disposed adjacent one another in a 3D block 100. The sides or sidewalls of the conductive elements 80 (such as high-density traces 86) may also be straight or perpendicular as viewed in cross-section when in a horizontal orientation (having been formed through an additive process within a mask) rather than sloped or tapered, as would result from a subtractive process.

In some instances, such as applications for power packages or power devices, low density routing of conductive elements 80 with a pitch less than or equal to 500 μm may be used. In such instances a cross-sectional area of the conductive elements 80 may also be sized or increased to accommodate the additional or higher power or current. Applications for other packages 200 with demands for high-density routing or very high-density routing of conductive elements (comprising vertical or 3D interconnects 100) may also be accommodated. As used herein, high-density or medium density routing means conductive traces have a pitch less than or equal to 100 μm, 70 μm, or 50 μm, and very high-density routing means the conductive traces have a pitch less than or equal to 20 μm. In instances where high-density or very high-density connections are desired, the current method may be better than forming vertical structures (such as with electroplating or electroless plating) because it will be less expensive, and also provide for very tall vertical interconnects, such as 3D blocks 100. The 3D blocks 100 may be formed without a glass carrier and may be incorporated within molded wafers or panels 114 of a full thickness. The 3D blocks 100 may be formed with one or more of high-density, tight pitch, and high aspect ratio, and may comprise conductive traces 86 or other conductive features comprising a pitch less than or equal to 20 μm.

A support material 70 may be formed around the conductive element 80, including being formed as one or more layers below, above, and completely or partially surrounding the conductive element 80. The support material 70 may comprise one or more layers of encapsulant or mold compound 90 or one or more layers of a polymer material or any suitable dielectric, including inorganic dielectrics. In some instances, the layers that are not mold compound may comprise one or more dielectric or polymer layers disposed on the sides, over, under, or both over and under the conductive elements 80 or conductive layers, RDLs, or traces 86, wherein the dielectric or polymer layers 70 comprise improved dielectric properties for better electrical performance than the encapsulant or mold compound 90, especially for high performance parts. The polymer or polyimide layers can provide higher resistance to leakage currents or higher breakdown voltage than mold compound 90 for high voltage applications, as well as superior electrical performance for high frequency signals.

The support material 70 can include one or more layers of mold compound, encapsulant, or one or more polymer layers, and may also comprise non mold compound layers, such as any suitable organic or inorganic material. The features and approaches presented in U.S. Pat. Application 63/347,516 titled "Molded Direct Contact Interconnect Build-up Structure Without Capture Pads," filed May 31, 2022, as well as the features and approaches presented in U.S. Pat. Application 63/391,694 titled "Molded Direct Contact Interconnect Substrate," filed Jul. 22, 2022 may also be used. U.S. Pat. Application 63/347,516 and U.S. Pat. Application 63/391,694 (in their entireties) are hereby incorporated by reference herein. The support material 70 can be one or more layers of $SiO_2$, $Si_3N_4$, SiON, $Ta_2O_5$, $Al_2O_3$, CDO, polyimide, BCB, PBO, epoxy, a soldermask material, or other material having insulating and structural properties formed by PVD, CVD, PECVD, screen printing, spin coating, spray coating, lamination, sintering, thermal oxidation, or other method. In some instances, the insulating or passivation layers can be included with the pre-formed or pre-made substrate or laminate layer.

Openings in the support material or insulating layer 70 can be formed to facilitate subsequent electrical interconnection with one or more conductive elements 80, or to provide structural support or a thermally conductive path. In some instances, layers of support material 70 (such as polymer layers) may comprise holes, vias, or openings through the polymer or polyimide (non-mold compound layer) so that layers of mold compound or encapsulant 90 can interlock or connect through the openings and through the polymer layers 70 and improve mechanical connection.

FIG. 2C, illustrates a top or plan view of the carrier or wafer 50 from FIG. 2B. FIG. 2C further illustrates the conductive pattern formed over, or on, the carrier. Section line 2A shows the section illustrated in FIG. 2A, with the section taken along a length of the conductive trace. Section line 4A shows the section illustrated in FIG. 4A, with the section taken perpendicular, transverse, or orthogonal to the length of the conductive trace.

FIG. 2D, continuing from FIG. 2C, illustrates the conductive element 80 being formed of multiple conductive layers 86 and support or insulating layers 74 being disposed over the substrate or carrier 60, 90, such as three insulating layers 70l, 70b, and 70c and two conductive elements or layers 86a, 86b. The barrier layer or adhesion layer and seed layers are not shown in this figure. The POSA will appreciate that any desired number of layers may be formed according to the configuration and design of the final product. The conductive elements 80 may comprise traces 86 for subsequent vertical or through component connections, and may be formed to comprise one or more of a capacitor 560, inductor 580, shielding, resistor, antenna or antenna feed, or other feature, examples of which are shown and described with greater detail in FIGS. 8A-8H. There may also be conductive elements (e.g. conductive vias 526) as part of conductive elements 80, 80a, 80b, or various conductive layers 86. The detail mark indicating FIG. 9, also references an instance in which IPDs may be present within wafer 60.

FIG. 2E, illustrates an instance in which polymer layers 74 are not used, and instead only mold compound or encapsulant 90 is used around and contacting conductive elements 80. Parts like QFNs, may benefit from using only mold compound 90 and no polymer layers 74, because the dielectric properties of the mold compound 90 are sufficient for device performance, such as lengths of wirebonds or conductive elements being short with low inductance (and little or no meaningful inductance from leads external to the body). Similarly, assemblies or components 200 may benefit from using only mold compound 90, 80 and no polymer layers 74, because of short RDLs and traces 86 that provide low inductance paths. In some instances, the encapsulant or mold compound 90 may be the same material as the molded carrier wafer 60, 90. The encapsulant or mold compound 90 can be deposited using a paste printing, compression molding, transfer molding, liquid encapsulant molding, lamination, vacuum lamination, spin coating, or other suitable application method. The encapsulant or mold compound 90 can be a polymer composite material, such as epoxy resin with filler, epoxy acrylate with filler, or polymer with or without filler. In some instances, the encapsulant 90 can be the same or similar as the encapsulant 42 used in forming embedded semiconductor die.

FIG. 2F, continuing from FIG. 2D or 3E, illustrates an example of the wafer, carrier, or panel 50 undergoing a grinding operation with a grinder 29 to planarize a back surface of the carrier 60 or the first encapsulant 90a to reduce a thickness of the carrier 60 or the first encapsulant 90a as well as the subsequently formed 3D blocks 100. In some instances, the wafer 50 may be thinned by a wet etch or plasma etch, such as when the carrier 60 comprises a Si wafer or other suitable material. In any event, a length L or width W of the material that will become the 3D blocks 100 (see, e.g. FIG. 2I) can undergo optional backgrinding, such as to take the length L or width W from about 500 µm to about 100 µm, 50 µm, 20 µm, or any suitable or desired thickness.

FIG. 2G, related to FIG. 2F, illustrates an example in which layer of encapsulant 90a or a wafer 60 is disposed over the first carrier 60a. Further, support material 70a, 70b, 70c, and conductive elements 80a, 80b are interleaved and formed over the layer of encapsulant 90a or wafer 60 and over the first temporary or sacrificial carrier 60a.

FIG. 2H, illustrates a cross-sectional profile view of the substrate or carrier 60, which may comprise a laminate layer, printed circuit board (PCB), as well as a blank mold compound panel. The substrate 60 in FIG. 2H can comprise various conductive elements 80, including conductive traces 86 formed over a first surface 66 of a substrate core or core material 62. Conductive elements 80 may further comprise planar structures 88 that may be part of a shield or antenna or capacitor or other element once the 3D blocks are formed, wherein the planar structures 88 are formed over a second surface 68 of the substrate core or core material 62 opposite the first surface 66. Unit specific patterning (also known under the tradename, Adaptive Patterning™) or direct imaging can be used for forming the conductive elements 80, including conductive traces 86 and planar structures 88. When the substrate 60 is formed as a blank mold compound panel, the core material 62 can comprise a material or material properties that are identical, similar, or functionally equivalent to one or more of encapsulant 42, or any subsequent encapsulant or mold compound layer 90, such as the first mold compound 90a, or the second encapsulant or mold compound 90b.

In some instances, the carrier 60 comprises a permanent wafer (which may comprise a silicon wafer, a semiconductor wafer, or a non-semiconductor wafer) that is singulated with the conductive element 80 and the support material 70 to form a portion of the plurality of 3D blocks 100, wherein the wafer comprises an active semiconductor device, passive device, circuit, or integrated circuit (IC) that is part of the plurality of 3D blocks. The conductive element 80 may further comprise, or may be coupled to, (as illustrated in the FIGS. including in FIG. 2D and FIGS. 8A-8H) at least a portion of one or more of a capacitor, inductor, shielding, resistor, antenna or antenna feed, voltage regulator, an ESD protection circuit, a clock or timing circuit, a passive devices for RF tuning, micro lasers, PMICs, IPDs, DTCs, decoupling capacitors, switches, memory including cache memory, fuses, and face down chips; one or more of which may be formed on, over, or within the carrier 60, such as when the carrier 60 is formed as a permanent wafer.

FIG. 2I, illustrates singulating the conductive element 80, the support material 70, and one or more of the carrier 60 and the encapsulant 90 or first encapsulant 90a to form a plurality of 3D blocks, molded blocks, or three-dimensional (3D) interconnect components 100. As illustrated in FIG. 2I, the 3D blocks 100 may be formed without SMDs 150, while in other instances SMDs 150 may be included. The wafer or panel 50, which comprises a conductive pattern formed over, or on, the carrier or substrate 60, can be singulated using a saw blade, grinding wheel, laser cutting tool, plasma cutting tool, or other suitable tool 32 into individual 3D blocks 100. Singulation of the wafer or panel 50 can cut conductive element 80 and expose the cut ends 102, 104 of conductive elements 80 for subsequent electrical connection or signal transmission in a vertical orientation. The 3D blocks 100 can comprise exposed first ends 102 and exposed second ends 104 of the conductive element 80, including, e.g., conductive elements 80, or other structures. The 3D block 100 can comprise any suitable size, and in some instances can comprise a height H (shown as horizontal direction in FIG. 2I) in a range of 0.4-2 mm, 0.05-0.5 mm, or about 0.6 mm. The 3D blocks can also comprise a length L or width W in a range of 0.5-20.0 mm, or about 1-5 mm, where greater widths may, e.g., be advantageous for display driver chips.

FIGS. 3A-3G illustrate the formation of assemblies or packages 200 comprising components 14 and one or more of the 3D blocks 100 comprising conductive elements 80, such as conductive layers or traces 86 comprising a vertical orientation. FIG. 3A illustrates providing a second carrier 60b, which can be similar or identical to the first carrier 60a, or any of the carriers or substrates described above. After providing the second carrier 60b, a plurality of 3D blocks 100 may be mounted over, and coupled to, the second carrier 60b such that the 3D blocks 100 are coupled to the second carrier 60b with the conductive elements 80 (including conductive traces or conductive layer 86) of the 3D blocks 100 being vertically oriented or rotated roughly 90 degrees (such as within a range of 45°-90°) from their previous horizontal orientation in which they were formed or made.

In some instances, the 3D blocks 100 may be coupled to the second carrier 60b with tape or adhesive 61. The 3D blocks 100 may avoid being mounted to the second carrier 60b with solder, bumps, or other structures as the 3D blocks 100 may subsequently undergo a grinding operation to expose first ends 102 or second ends 104 (which are shown as the top ends 102 and bottom ends 104 in FIG. 3A). In some instances, blocks 100 may be stacked on or over each other to a height of more than one 3D block 100 over the second carrier 60b.

As shown in FIG. 2I, the 3D blocks 100 are removed from the first carrier 60a, which may include the tape 61. The 3D blocks 100 may be in an either an organized assembly or an unorganized assembly when over the first carrier 60a. The 3D blocks 100 may be organized or positioned on the second carrier 60b in an orderly or desired manner (as shown in FIG. 3A) through a pick and place operation or through a hybrid self-assembly. The hybrid self-assembly may comprise using a liquid and capillary action to orient parts on a surface. The orientation process may also comprise using a vibratory feeder to orient a bulk group of 3D blocks 100—and may further comprise including features (e.g. physical protrusions or optical markings, or other suitable feature or marker) in or on the 3D block 100 that could assist with orientation in the feeder or placement on the second carrier 60b. When present, a feature on the 3D block 100 could, e.g., comprise a mass configured in a certain location in or on one or more of the 3D blocks 100. In other instances, one or more pieces of specialized mechanical equipment or mechanism may be used (together with other known equipment such as in a pick and place operation) that rotates the 3D block 90 degrees (or about 90 degrees) as it is picked off the first carrier (or dicing tape) 60a and then passes the 3D block 100 to a placement head, and then is mounted on the second carrier 60b. The placement of the 3D blocks 10 may happen in one or more steps and may or may not include an intermediate step.

FIG. 3B, illustrates disposing a plurality of components 14 (or embedded components 44) over the second carrier 60b and disposed adjacent each of the plurality of 3D blocks 10, respectively. The left side of FIG. 3B illustrates a single layer of components 14 may be used. The right side of FIG. 3B illustrates the option for stacked components 14 or multiple layers of components 14, 160. The left side and the right side of FIG. 3B are separated by the discontinuity line 106 to indicate different ways in which different first carriers 60a may be organized, where 3D blocks 100 comprise about a same height across an entirety of the first carrier 60a, so as to facilitate subsequent grinding as illustrated in FIG. 3C. As a non-limiting example, a small cache chip 160 could be pre-attached on a larger processor chip. 3D blocks 100 may be placed one at a time for one assembly or package 200, 210, 220, etc. at a time. However, in other instances, 3D blocks 100 may be placed in long strips that extend across what will be many final assemblies or packages 200, 210, 220 etc. and included within the reconstituted wafer or panel 114 to be singulated at a later time, such as shown with the singulation in FIG. 3G. In some instances, the 3D blocks 100 may be first attached to the second carrier 60b (before the components 14), while in other instances the components 14 may be mounted to the second carrier 60b before the 3D blocks 100, and in yet in other instances, both components 14 and the 3D blocks 100 may begin to be placed before the plurality of either the 3D blocks 100 or the components 14 are fully placed on the second carrier 60b.

FIG. 3C, illustrates disposing encapsulant 110 over the second carrier 60b and around the plurality of 3D blocks 100 and around the plurality of components 14 to form a reconstituted wafer or panel 114. A dashed line is used to indicate a location of each 3D block 100, which a POSA will understand the dashed line to be an identifier of location, rather than the dashed line itself being a structural feature or component, which it is not. The molded panel or reconstituted panel 114 may undergo a grinding process with grinder 29 (or other suitable process) to expose the conductive elements 80 (including conductive layers 86), and to form or expose first ends 102 of the conductive elements 80 (including conductive layers 86). The exposed first ends 102 of the 3D blocks 100 may be coupled to, and provide an electrical path to, the conductive studs 28 of the components 14, as shown in FIG. 3C.

FIG. 3Cp illustrates a plan view of a portion of the molded panel or reconstituted panel 114 taken along the detail line 3Cp shown in FIG. 3C.

FIG. 3D, illustrates forming a first interconnect structure 120 over a first surface 115 of the reconstituted panel 114 and coupled with first ends 104 of the vertically oriented conductive elements 80 within the 3D blocks 100, which are further coupled with electrically conductive studs 128 on the components 14. In addition to, or in place of, the first interconnect structure 120, one or more 3D blocks 100 may be coupled to (or directly contact) a bridge chip components, other 3D blocks 100, other stacked features, and even multiple iterative layers of components and interconnect structures, an example of which is shown, e.g., in FIG. 6A.

The first interconnect structure 120 may be coupled to solder balls, or other suitable electrically conductive material or interconnection 128, as well as forming the first interconnect structure as a build-up interconnect structure 128 comprising any desirable number of conductive layers 124 and insulating layers 122 depending on the configuration, design, and routing requirements of the final device or semiconductor component package 200. A non-limiting example of an interconnect structure formed as a build-up interconnect structure 120 is shown and described with respect to FIG. 3D. The build-up interconnect structure 120 can comprise an electrically conductive layer or a RDL 124 that is patterned and deposited over the chip or embedded semiconductor die 14, including conductive interconnects 28, and the exposed conductive element 80 of the molded blocks 100. Unit specific patterning (Adaptive Patterning™) or direct imaging can be used for forming the build-up interconnect structure 120. The interconnect structure or build-up interconnect structure 120, can also comprise one or more intermediate insulating or passivation layers 122. The insulating layers 122 can be one or more layers of SiO2, Si3N4, SiON, Ta2O5, Al2O3, CDO, polyimide, BCB, PBO, dielectric, encapsulant, mold compound, or other material (including those of support material 70) having insulating and structural properties formed by PVD, CVD, screen printing, spin coating, spray coating, sintering, or thermal oxidation or other suitable process.

The conductive layers 124 in the interconnect structure 120 can be one or more layers of Al, Cu, Sn, Ni, Au, Ag, Ti, W, Co, Ta, In, Pd, Pt or a coupling agent, copper, or other suitable electrically conductive material. The conductive layers 124 can be formed using PVD, CVD, PECVD, electrolytic plating, electroless plating, or other suitable process. In an embodiment, conductive layer 124 is an RDL comprising a Ti barrier or adhesion layer, a Cu seed layer, and Cu layer formed over the Ti barrier layer and the Cu seed layer. In some instances, one or more layers of titanium (Ti), tungsten (W), tantalum (Ta), chrome (Cr), vanadium (V), niobium (Nb), rhenium (Re), any refractory metal, or other suitable material may also be used for a portion (including all) of the barrier or adhesion layer. The conductive layer 124 can provide interconnection between the 3D blocks, the chips or components, other features within the completed semiconductor component package or assembly, and external objects, for the transmission of electrical signals, power, ground, or other connection. One or more layers in the interconnect structure may also provide an optical paths for connection to 3D blocks that include an optical waveguide or other optical feature.

FIG. 3E, illustrates flipping the reconstituted wafer or panel 114 onto a third carrier 60c, and removing the second carrier 60b. The solder balls 128 shown in FIG. 3E may or may not be present and are shown only as one example of the potential structure.

FIG. 3F, illustrates forming a second interconnect structure or build-up interconnect structure 140 (similar to the first interconnect structure 120) formed over a second surface 116 of the reconstituted wafer or panel 114 opposite the first surface 115 of the reconstituted wafer or panel 114. The second interconnect structure 140 is coupled with exposed second ends 104 of the conductive element 80 of the 3D block 100, which may comprise high-density conductive traces 80. The wafer or panel 114 may undergo an optional grinding step to planarize, thin, or both planarize and thin, the wafer or panel 114 before forming the second interconnect structure 140. In either event, the second interconnect structure 140 can include UBMs, interconnect structures, or land pads 146 so that additional chips or components (160 or other) can be mounted over the packages 200, such as by soldering or other suitable method—such as to form a package on package (PoP) assembly or package 202, as shown, e.g., in FIG. 5A. Other assemblies or packages 200, 230 could be placed on or over the second interconnect structure 140 and the process repeated to result in multiple layers of assemblies or packages 200, 230, examples of which are included in FIGS. 6A and 6B.

Unit specific patterning (also known under the tradename "Adaptive Patterning™") which may include laser direct imaging (LDI), may also be present in the formation of interconnect structures 120 and 140. Unit specific patterning allows for unit specific shift or movement experienced by components 14 and 3D blocks 100 to measured, accounted for in a new design. The new unit specific designs or features may be built, such as by adjusting one or more conductive layers 124, 144 to account for the new measured positions of components 14 and the 3D blocks 100, which can be different from an original design position. For example, the pick and place of both components 14 and blocks 100 on the second carrier 60b (as illustrated in FIGS. 3A and 3B), as well as the molding or placement of encapsulant 110 shown in FIG. 110, will often include displacement or movement of components 14 and blocks 100 from an intended, original, or design position. The displacement, movement, or both may result in even more misalignment, shift, and rotation, than is present with conventional fan-out wafer level packaging (FOWLP) that involves on type and size of components, like components 14 without the 3D blocks 100.

The unit specific patterning may be advantageously employed for conductive layers 124, 144, formed, e.g., as RDLs and coupling or connecting components 14 to 3D blocks 100. Additionally, unit specific patterning may also be advantageously employed for coupling or connecting components 14 and 3D blocks 100 to UBMs, interconnect structures, BGA patterns, or LGA patterns 126 and 146. As such, an alignment between the conductive layers 124, 144 and to one or more of the components 14, 3D blocks 100, and UBMs, interconnect structures, BGA patterns, or LGA patterns 126 and 146, will be consistently or universally greater than an alignment between the same features without unit specific patterning.

FIG. 3G, illustrates singulating the reconstituted wafer or panel 114, including the first interconnect structure 120 and second interconnect structure 140 (when present) to form a plurality of individual assemblies or packages 200.

FIGS. 4A-4F illustrate another aspect of forming 3D blocks 100 with conductive elements 80 comprising conductive layers 86 formed with a horizontal orientation and further embedding the same in a vertical orientation within the assembly or package 200.

FIG. 4A, illustrates a first carrier or wafer 60a or substrate or encapsulant 90 with conductive elements 80 formed thereon, similar to the structure illustrated in FIG. 2A. FIG. 4A further illustrates that the feature of SMDs 150 may coupled to a portion (less than all) of the conductive elements 80. In some instances, the arrangement shown in FIG. 4A may be considered a pre-molded Cu post method for 3D interconnect and comprise passives or SMDs 150.

FIG. 4B, illustrates an enlarged or close-up orthogonal view of one of the SMDs 150 (such as a capacitor) from FIG. 4A.

FIG. 4C, continuing from FIG. 4A illustrates the structure of FIG. 4A with an encapsulant or mold compound 90b disposed over, and in contact with, the SMDs 150 and the conductive elements 80 (including conductive layers or traces 86), similar to the structure shown in FIG. 2E. Similar to FIG. 2F and FIG. 3C, the molded wafer or panel 114 comprising SMDs 150 may also undergo a grinding process to thin the molded wafer or panel. The molded wafer or panel 114 may also serve as a temporary carrier 60 for subsequent processing.

FIG. 4D, continuing from FIG. 4C, illustrates the reconstituted wafer or panel 114 from FIG. 4C being cut or singulated into 3D blocks 10 with a saw, laser cutting tool, or plasma cutting tool 32. As shown in FIG. 4D, a number of the 3D blocks 100 may be formed with SMDs 150 and a number of the 3D blocks 100 may be formed without SMDs 150.

Figure 4E:
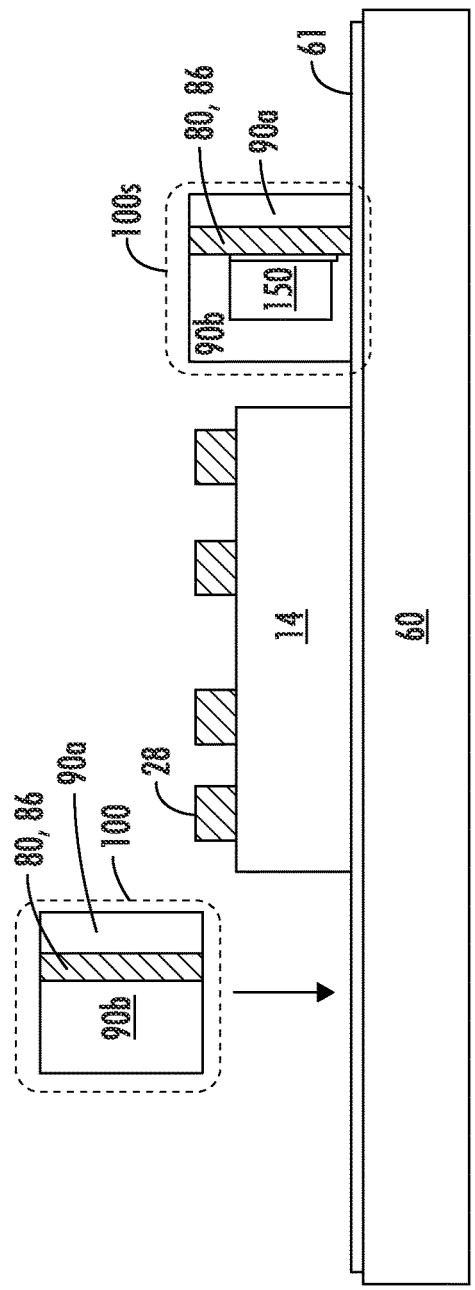

FIG. 4E, continuing from FIG. 4D, illustrates a process of mounting the component 14 and the 3D molded blocks 100 to a second carrier 60b, similar to what was shown and described with respect to FIGS. 3A and 3B.

Figure 4F:
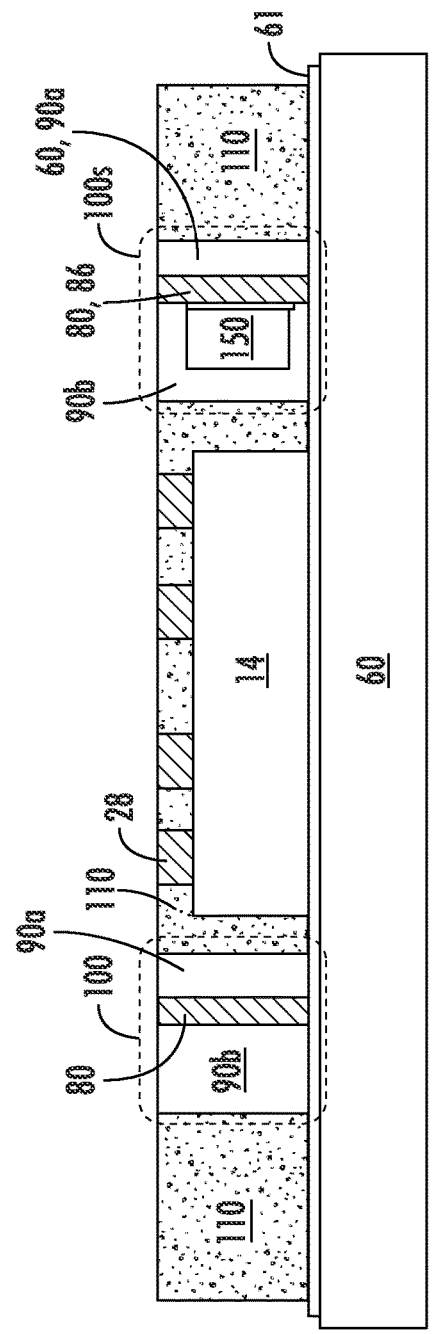

FIG. 4F, and continuing from FIG. 4E, illustrates a process of disposing encapsulant or mold compound 110 around the component 14 and the 3D molded blocks 100 to form a reconstituted wafer or panel, similar to what was shown and described with respect to FIG. 3C. Additionally, the reconstituted wafer can also undergo a grinding operation. Further, first and second interconnect structures 120, 140 may be formed over the reconstituted wafer of FIG. 4F, and the final assembly or package 200 may be singulated from the reconstituted wafer, similar to what was shown and described with respect to FIGS. 3D-3G.

Figure 5A:
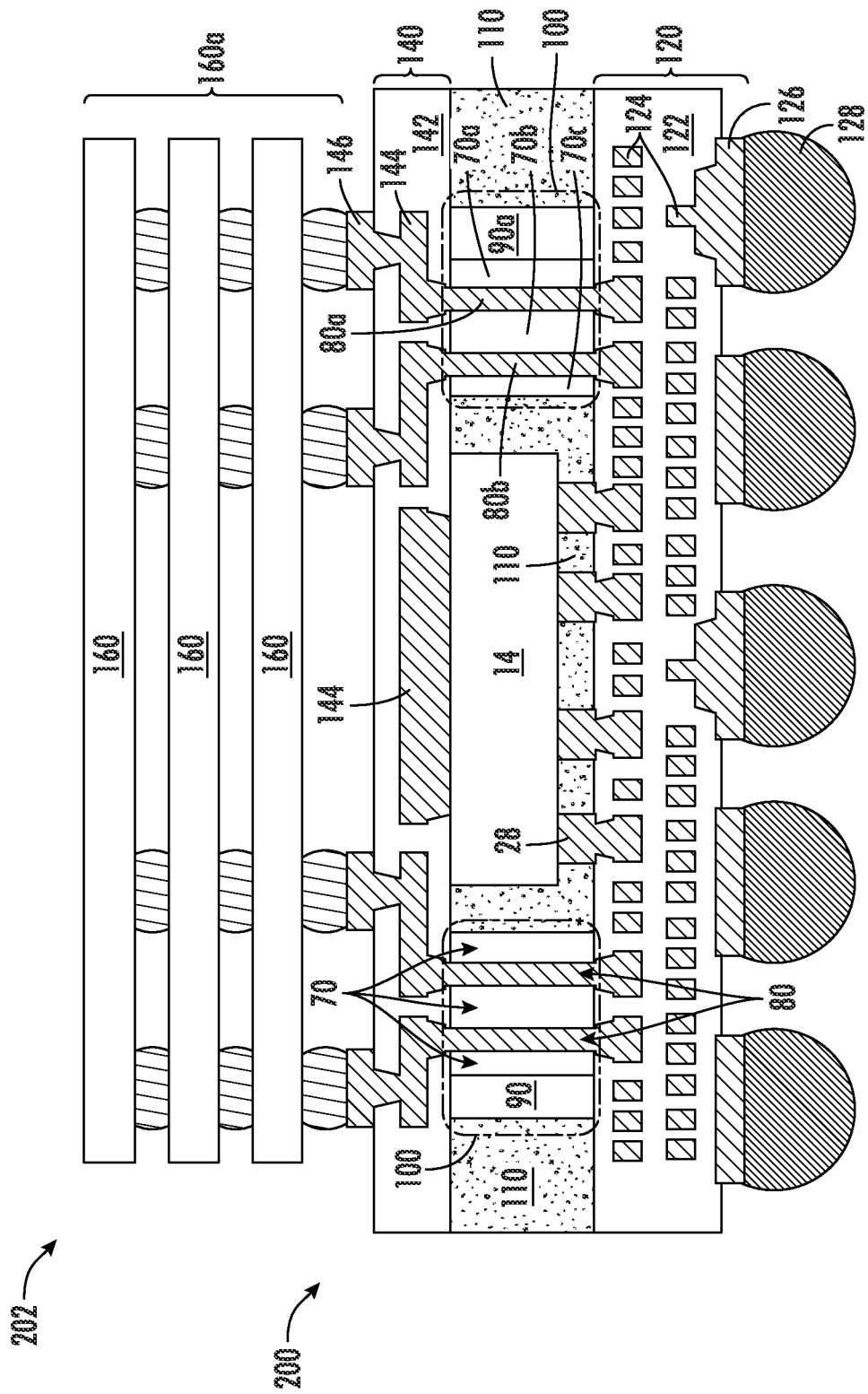
FIGS. 5A-5B illustrate semiconductor assemblies comprising 3D blocks coupled with stacked components, such as in a package on package (POP) arrangements.
Figure 5B:
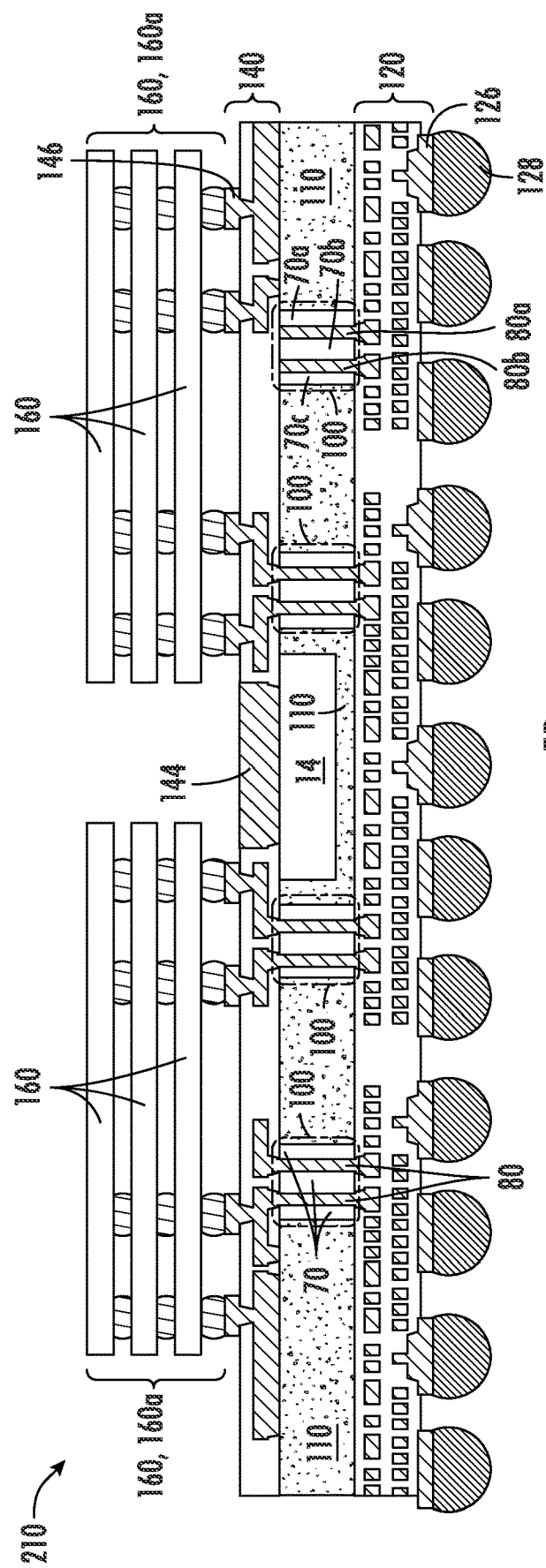

FIGS. 5A-5B illustrate semiconductor assemblies or packages 200 comprising stacks or 3D blocks of components 160 coupled with the interconnect structure 140 to form a package on package (POP) structure 202. The stacks may comprise any suitable components 160, including wire-bonded packages, TSV stacked packages, and 3D-stacked memory devices such as high bandwidth memory (HBM). FIG. 5A, illustrates stacked components 160, which may be disposed over at least one of the plurality of components 14 adjacent, or laterally offset from, the 3D blocks 100.

The stacked components 160 may be formed partially or fully over at least one of the plurality of components 14. The stacked components 160 can be directly over the embedded component 14 or chip (as shown in FIG. 5A) or the stacked components 160 may be offset with respect to the embedded component 14 or chip (as shown in FIG. 5B). When the stacked components 160 are disposed over the embedded component 14, both can share a common footprint, whether partially or completely. When arranged to share a common footprint, the stacked components 160 may be disposed over, and oriented towards, the frontside (or active layer 20 if present) of the embedded component 14. That arrangement also allows for a heat sink 144 to be disposed, positioned, or formed, over the back surface 18 of the embedded component 14 to assist with, facilitate, or improve heat transfer and thermal performance. In other embodiments, the stacked components 160 may be disposed over, and oriented towards, the back surface or backside 18 of the embedded component 14 and be offset from over a heatsink 144 disposed over and thermally coupled to the backside 18 of the embedded component 14.

FIG. 5B, illustrates the stacked components 160, 160a offset with respect to the component 14, while still being coupled with the 3D blocks 100. The 3D blocks 100 may also be formed as molded blocks 100. In either event, the assembly or package 210 may be further disposed over TSVs, vias, or through-holes in laminate substrates or PCBs and other 3D structures known in the art. In some instances, groups of semiconductor assemblies 210, etc. may be coupled adjacent one another.

Figure 6A:
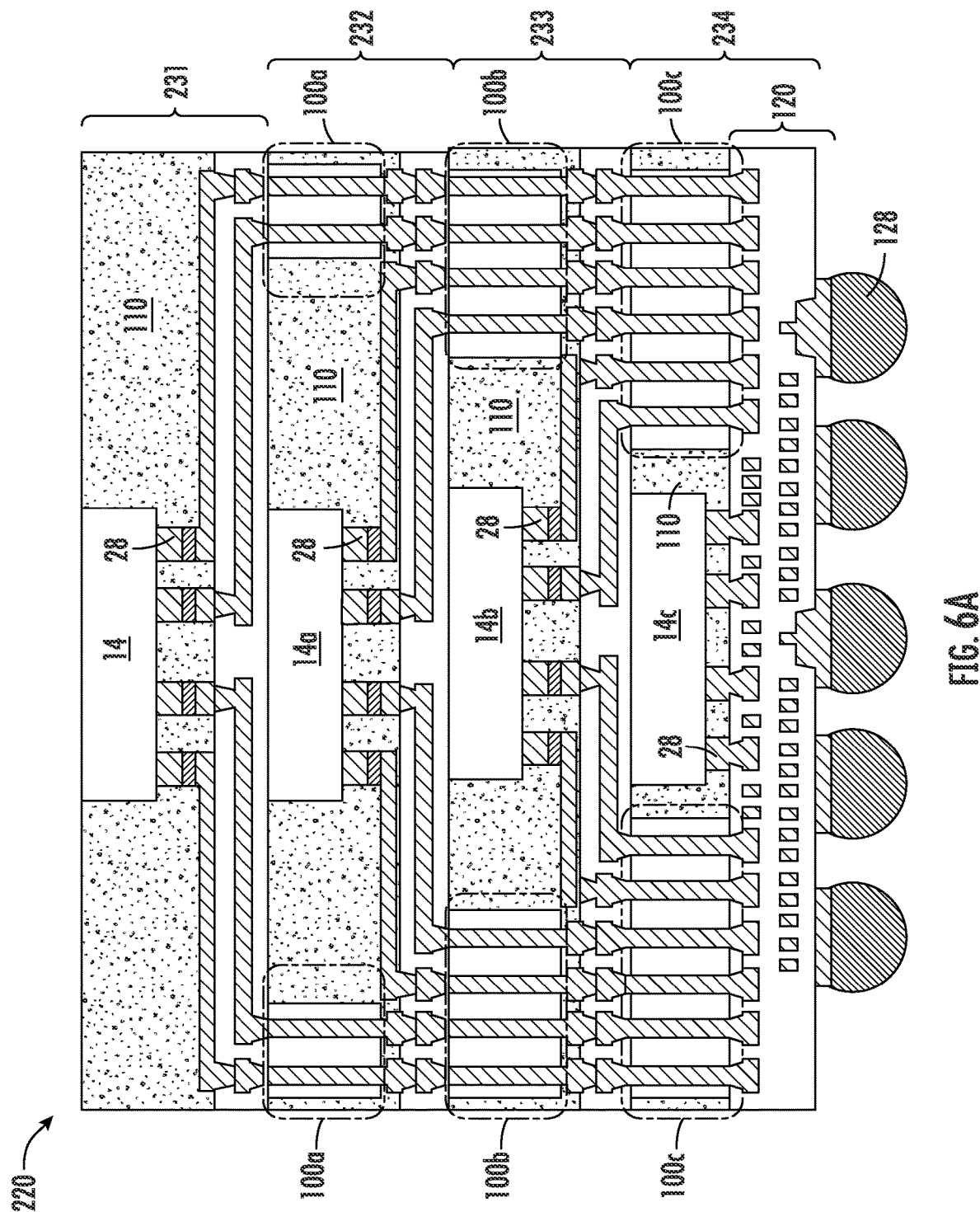

FIGS. 6A-6B illustrate stacks of semiconductor assemblies 231, 232, 233, 234 comprising 3D blocks 100, 100a, 100b, and 100c, respectively, wherein the 3D blocks 100 may comprise conductive elements 80. FIG. 6A, illustrates 4 vertically stacked semiconductor assemblies 231, 232, 233, and 234, with 3D blocks 100 of varying sizes and dimensions, with differing numbers of conductive elements 80 within the 3D blocks 100a, 100b, and 100c. The number of conductive elements 80 within the 3D blocks 100, such as 3D blocks, 100a, 100b, and 100c may vary depending on a needed configuration and design of the assembly or package 220, such as to accommodate a greater or lesser number of conductive vertical interconnects 80. For example, in the cross-sectional view of FIG. 6A, 3D blocks 100a comprise two layers or rows of conductive elements 80, 3D blocks 100b comprise three layers or rows of conductive elements 80, and 3D blocks 100c comprise three layers or rows of conductive elements 80.

FIG. 6B, is similar to FIG. 6A and illustrates 4 vertically stacked semiconductor assemblies 231, 232, 233, 234, with multiple semiconductor components 14 and multiple 3D blocks 100a, 100b, 100c, respectively, included within each layer. The multiple 3D blocks 100 within each vertical layer may comprise 3D blocks 100 of varying sizes and dimensions, with differing numbers of conductive elements 80 for the 3D vertical interconnect. The dimensions and number of interconnects may vary depending on needed configuration and design, such as to accommodate a greater or lesser number of interconnects or layers of conductive elements 80, as well as different elements or features formed by the conductive elements 80. As illustrated in assembly 232 of FIG. 6B, the 3D conductive elements 80 of the 3D blocks 100a may extend to an upper surface of the assembly 232, without being capped by a build-up interconnect structure (e.g. 120, 140). In other instances, the 3D conductive elements 80 of the 3D blocks 100 may extend through an entire height of the assembly or package 232, without being capped on either side by a build-up interconnect structure, as shown, e.g., in FIG. 4F.

Figure 6C:
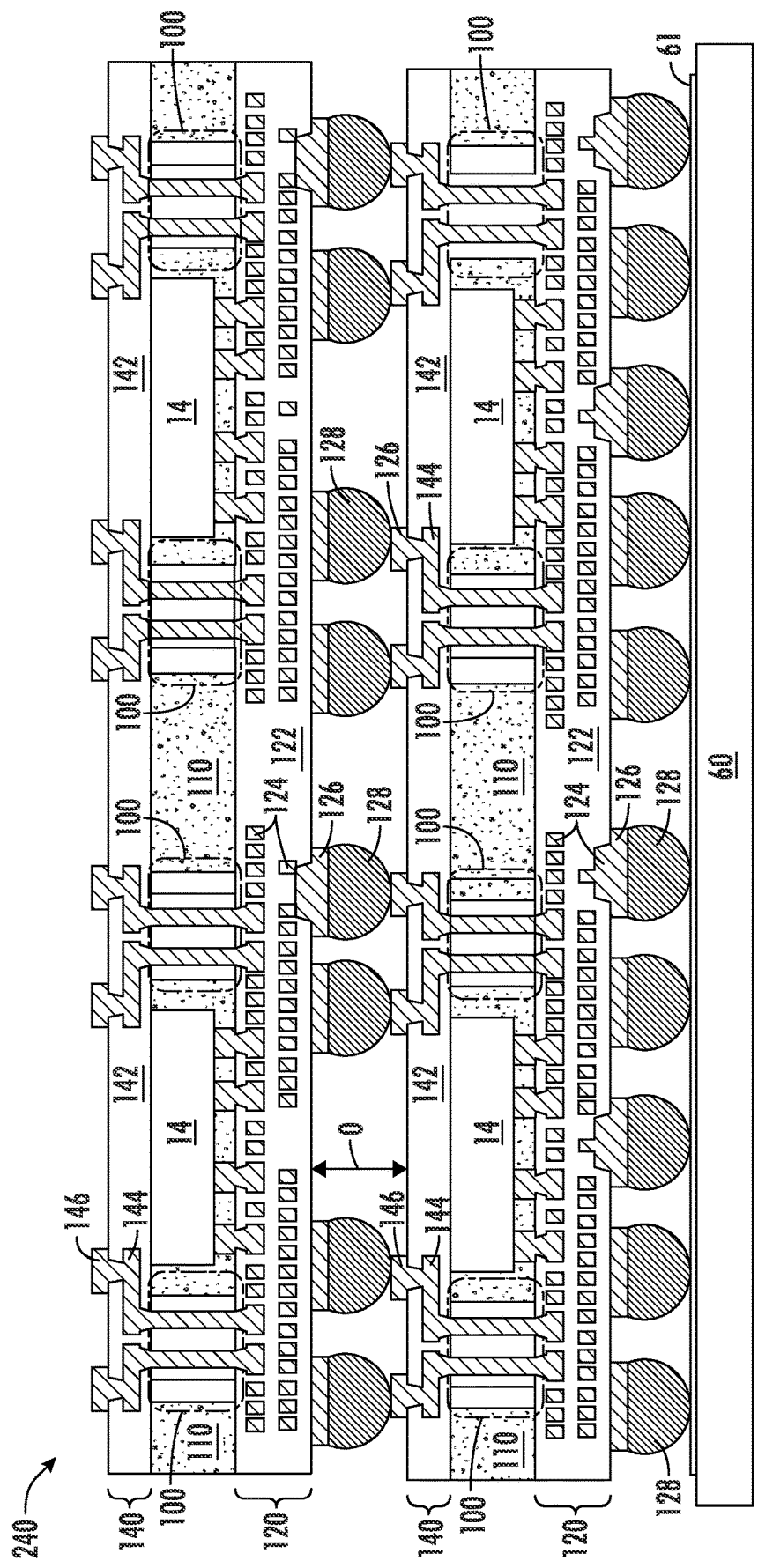

FIG. 6C, continuing from FIG. 3F, illustrates that the formation of vertically stacked assemblies 240 with multiple layers or assemblies, which can occur at the reconstituted wafer level before singulation shown, e.g., in FIG. 3G.

Figure 7A:
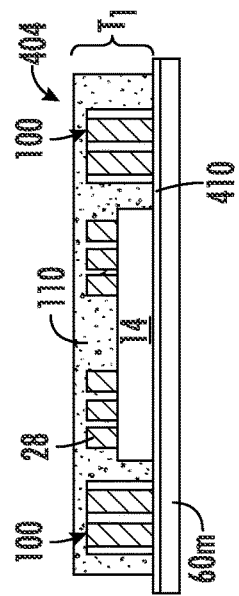
FIGS. 7A-7T illustrate another instance of forming semiconductor assemblies comprising semiconductor components and the 3D blocks.
Figure 7B:
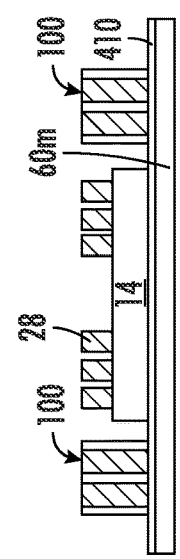
Figure 7C:
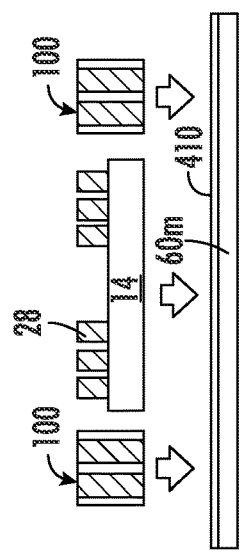
Figure 7D:
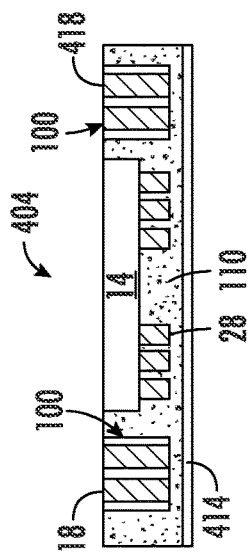
Figure 7E:
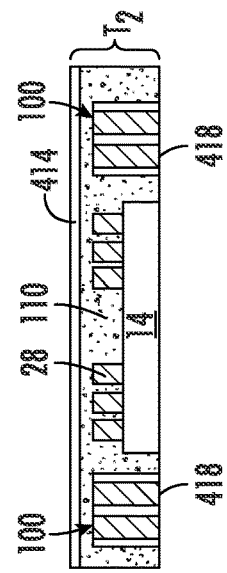
Figure 7F:
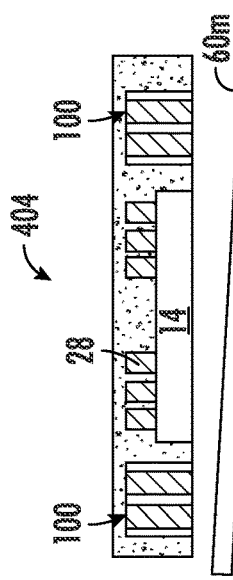
Figure 7R:
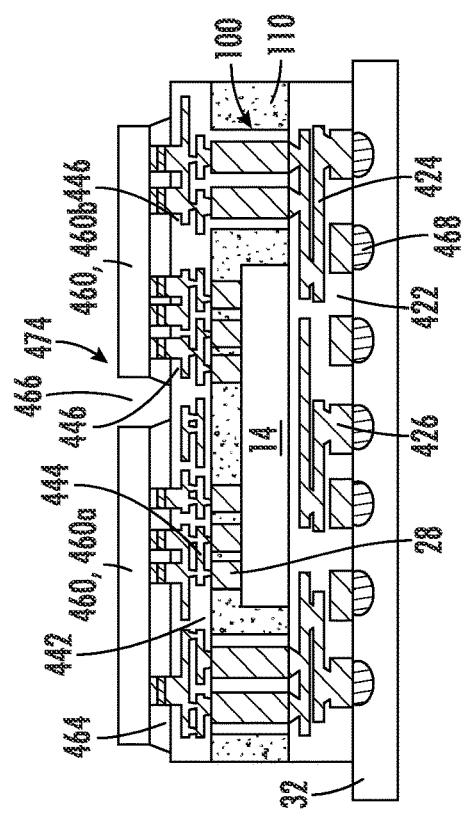
Figure 7S:
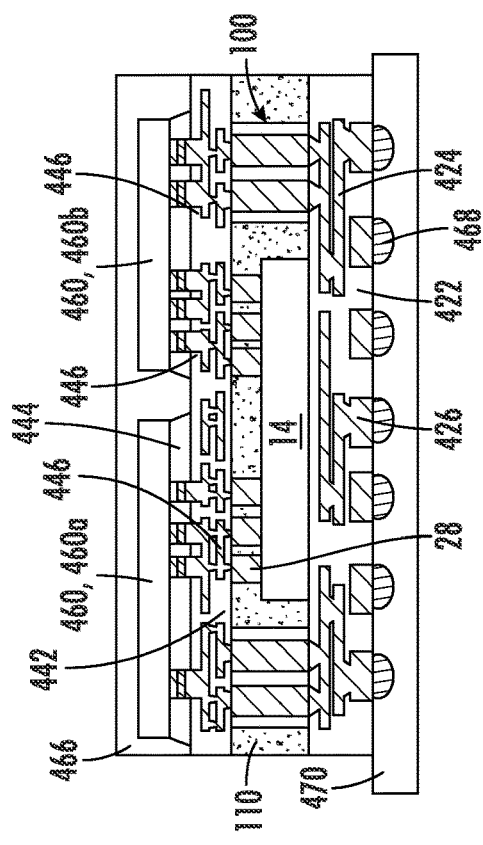
Figure 7T:
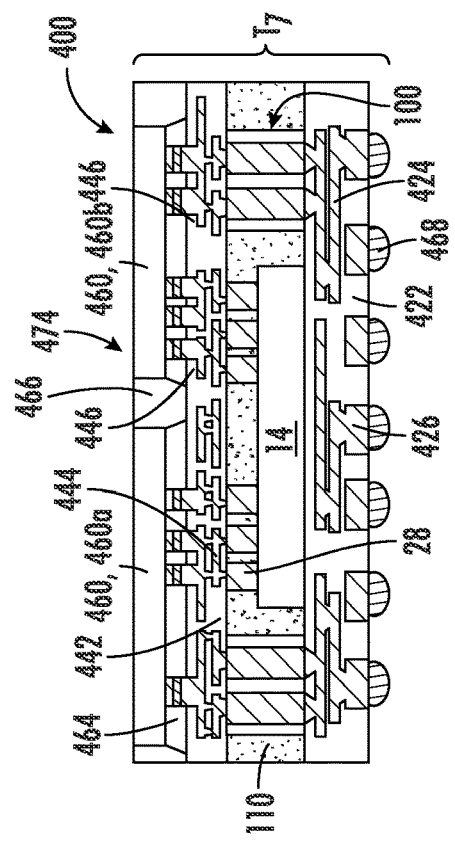

FIGS. 7A-7T illustrate method and process of forming an assembly or package 400 comprising 3D blocks 100 using metal or other suitable carrier 60m that is not a glass carrier. While FIGS. 7A-7T illustrate the process with respect to one shown component 14, the POSA will appreciate that the process will occur for a plurality of components 14 as part of reconstituted wafer or panel level process.

FIG. 7A illustrates providing the carrier 60m with a thermal die attach tape 410 coupled thereto, and disposing thereover, the component 14 and 3D blocks 100 with respect to the carrier 60m. The 3D blocks 100 may be rotated about 90 degrees from orientation in which they were formed before being positioned over the carrier 60m, similar to what was shown in FIGS. 2I and 3A. While one component 14 is shown, the POSA will understand that many components 14 and 3D blocks 100 may be coupled thereto (similar to the views of FIGS. 3A-3G) and that only one component 14 (of a larger whole such as is illustrated in FIG. 1D and FIG. 2C) is being shown for ease of illustration.

FIG. 7B illustrates mounting or coupling the component 14 and 3D blocks 100 to the carrier 60m with the thermal die attach tape 410, or other suitable adhesive. The carrier 60m may be like other carriers 60 described herein, including being sized to allow for the formation of 600 mm by 600 mm panels, and may also advantageously exclude glass carriers.

FIG. 7C illustrates disposing encapsulant 90 over and around the component 14 and 3D blocks 100 to form a molded panel 404, only a portion of which is shown in FIG. 7C. The molded panel 404 may comprise a thickness $T_1$ of about 725 µm or in a range of about 700-750 µm.

FIG. 7D illustrates debonding the carrier or metal carrier 60m from the molded panel 404. FIG. 7E illustrates placing a front side lamination (FSL) 414 over the encapsulant 110 of the molded panel 404. The FSL 414 comprises thickness of about 40 µm, or in a range of about 30-50 µm. The molded panel 404 with FSL 414 comprises a thickness $T_2$ of about 765 µm, or in a range of about 730-800 µm. FIG. 7F illustrates rotating or flipping upside down the molded panel 404. A backside clean, such as a copper clean, of exposed (backside) surfaces 418 of the 3D blocks 100 may occur, including cleaning the conductive elements 80 that are now vertically rather than horizontally aligned.

FIG. 7G illustrates forming a first (backside) interconnect structure 420 or first (backside) build-up interconnect structure over the cleaned surfaces 418 of the 3D blocks 100. The materials of the interconnects structure 420 may be the same or similar to what was described with respect to interconnect structure 120. The interconnect structure 420 can comprise one or more insulating or passivation layers 422 as part of the interconnect structure 420, and in some instances may comprise 3 insulating layers at a thickness of about 11 µm each. The interconnect structure 420 can further comprise one or more electrically conductive layers or RDLs 424, and in some instances may comprise two conductive layers at a thickness of about 9 µm. The interconnect structure 420 can further comprise UBM or interconnect structures 426, which in some instances may comprise a thickness of about 9 µm. The thickness $T_3$ of panel 404 comprising interconnect structure 420 may be about 825 µm, or in a range of about 800-850 µm.

FIG. 7H illustrates a laminate or backside laminate 430 disposed over UBMs 426 and interconnect structure 420. Panel 404 with interconnect structure 420 and laminate 430 may comprise a thickness $T_4$ of about 865 µm or in a range of about 800-900 µm.

FIG. 7I illustrates rotating or flipping back right side up of the molded panel 404 and cogrinding the FSL 414 and the encapsulant 90 to expose and clean the (frontside) surfaces 434 of the 3D block 100, which are opposite exposed (backside) surfaces 418 of the 3D block 100. Portions of conductive elements 80 are also cleaned, which are now vertically rather than horizontally aligned. Panel 404 with interconnect structure 420 and without laminate 430 may comprise a thickness $T_5$ of about 785 µm or in a range of about 760-810 µm.

FIG. 7J illustrates forming a second (frontside) interconnect structure 440 or second (frontside) build-up interconnect structure 440 over 3D blocks 100 and conductive studs 28 of component 14. The materials of the interconnects structure 440 may be the same or similar to what was described with respect to interconnect structure 140. The interconnect structure 440 can comprise one or more insulating or passivation layers 442 as part of the interconnect structure 440, and in some instances may comprise 3 insulating layers at a thickness of about 11 µm each. The interconnect structure 440 can further comprise one or more electrically conductive layers or RDLs 444, and in some instances may comprise two conductive layers at a thickness of about 9 µm. The interconnect structure 440 can further comprise UBM or interconnect structures 446, which in some instances may comprise a thickness of about 9 µm. The thickness $T_6$ of panel 404 comprising interconnect structures 420 and 440 may be about 845 µm, or in a range of about 820-870 µm.

FIG. 7K illustrates segmenting the molded panel 404 with saw blade or cutting tool 32 into individual sub-panels 450 of about 300 mm×300 mm square.

FIG. 7L illustrates a clean of UBMs 446 and coupling of additional chips, devices, packages 460 to frontside interconnect structure 440. In some instances, the chips 460 may comprise an HBM, or memory 460a and a processor 460b. The chips 460 may be flip chip mounted using thermocompression bonding or any other suitable bonding to join the chips 460 to the interconnect layer 440. The thickness $T_7$ (of sub-panels 450 or panel 404 with interconnect structures 420 and 440 can be about 1600 µm (or 845 µm+720 µm+35 µm).

FIG. 7M illustrates a vacuum underfill or molded underfill (MUF) 464 disposed under the chips 460 to provide additional mechanical support. FIG. 7N illustrates an over mold or layer of encapsulant or mold compound 466 disposed over and around the chips 460. Encapsulant 466 may be the same or similar as encapsulant 110. FIG. 7O illustrates segmenting the molded panel 404 with saw blade or cutting tool 32 into individual sub-panels 450 of about 300 mm×300 mm square (if not done previously as shown and discussed with respect to FIG. 7K. FIG. 7P illustrates rotating or flipping the subpanel 450 upside down again and conducting a backside grind to remove laminate 430 and to reveal UBMs 426. The thickness $T_7$ of the individual sub-panels 450 can be about 1.6 mm or in a range of about 1.4-1.8 mm.

FIG. 7Q illustrates a ball attach for IO package interconnects or conductive bumps 468. FIG. 7R illustrates laminating backgrind tape 470 over the conductive bumps 468. FIG. 7S illustrates a grinding or planarizing step, such as with grinder 29, to planarize and reveal backside of devices 460 and to reduce an overall height of assembly or package 400. FIG. 7T illustrates singulating the molded panel 404 or subpanel 450 with saw blade or cutting tool 32 into individual assemblies or packages 400, removing tape 470 such that the assemblies or packages 400 are ready to be loading, such as into JEDEC trays, for shipping or for further assembly. Assemblies 400 comprise a thickness $T_7$ of the individual sub-panels 450 can be about 1.6 mm or in a range of about 1.4-1.8 mm.

Figure 8A:
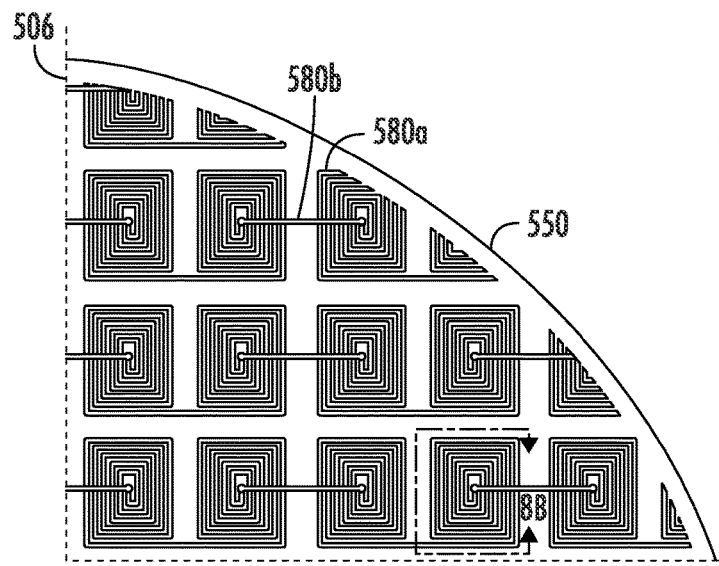
FIGS. 8A-8H illustrate various instances of conductive elements that may be formed as part of the 3D blocks.

FIGS. 8A-8H illustrate various instances of conductive elements 80 that may be formed as part of the 3D blocks 100. FIGS. 8A-8D illustrate the 3D blocks 100 being formed as RDL inductors 580, over or as part of wafer, or panel 550. FIG. 8A illustrates a plan view of a portion of a wafer or panel, similar to the wafer or panel illustrated in FIG. 2C. An upper right portion of the circular wafer or reconstituted panel 550 is illustrated, bordered by discontinuity lines 506, which are similar to discontinuity lines 106. The RDL inductors 580 may comprise multiple specific instances of conductive element 80, such as conductive elements 580a and 580. Conductive element 580a is a wound conductive coil that forms a first portion of the inductor 580. Conductive element 580b is formed over the conductive element 580a and is coupled to the first conductive element 580a through a conductive via 526. The conductive elements 580a and 580b may comprise one or more of a barrier layer, an adhesion layer, and a seed layer. The conductive elements 580a and 580b, when singulated, also form exposed first ends 502 and exposed second ends 504 that are used for interconnection as part of the 3D blocks 100.

Figure 8B:
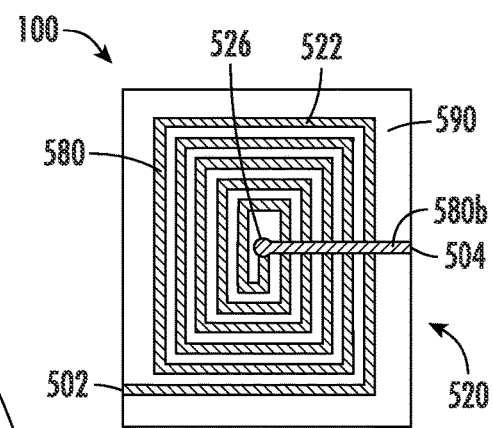

FIG. 8B illustrates an enlarged plan view of a single unit of a conductive element or RDL inductor 580, taken along the detail mark 8B shown in the FIG. 8A. The RDL inductor 580 is shown disposed over encapsulant 590. The first conductive element 580a is further shown comprising RDL conductors 520, first conductive layer or feature 522 (formed as an inductor coil), and second conductive element 524.

Figure 8C:
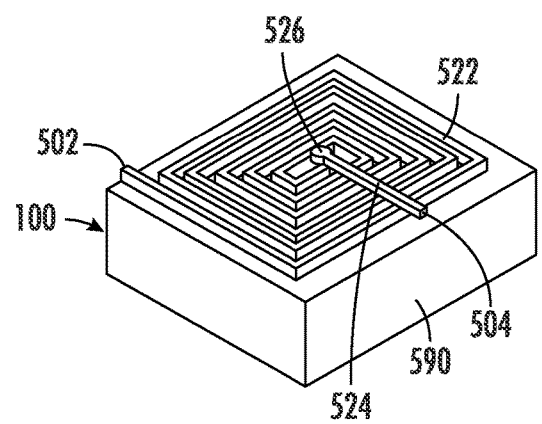
Figure 8D:
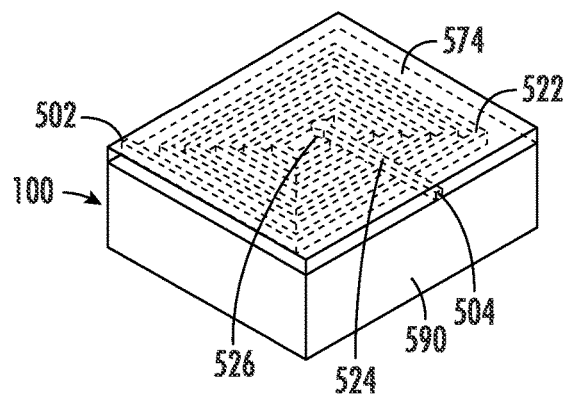

FIG. 8C illustrates an isometric view of the RDL inductor 580 formed as a 3D block 100, similar to what was shown in plan view in FIG. 8B. FIG. 8D illustrates another isometric view of the RDL inductor 580, similar to the view illustrated in FIG. 8C. FIG. 8D differs from FIG. 8C by the inclusion of the dielectric layer 574, which may be similar or identical to the other support materials 70 or dielectrics described herein.

Figure 8E:
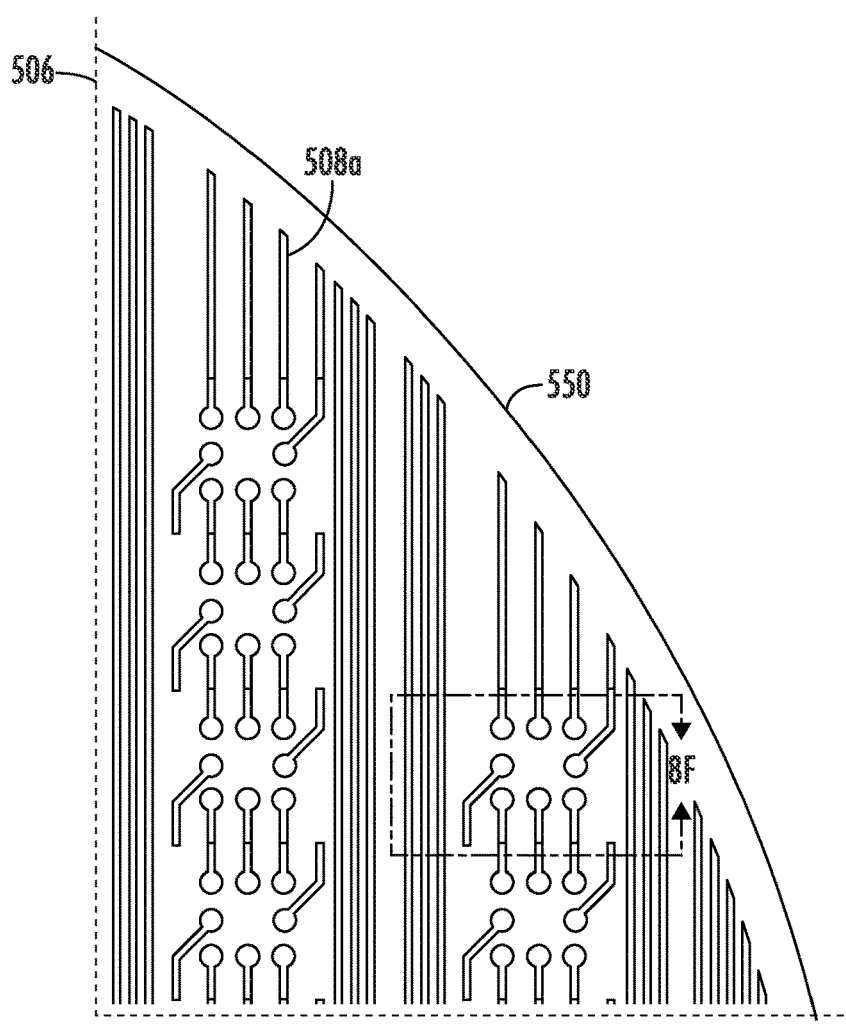
Figure 8F:
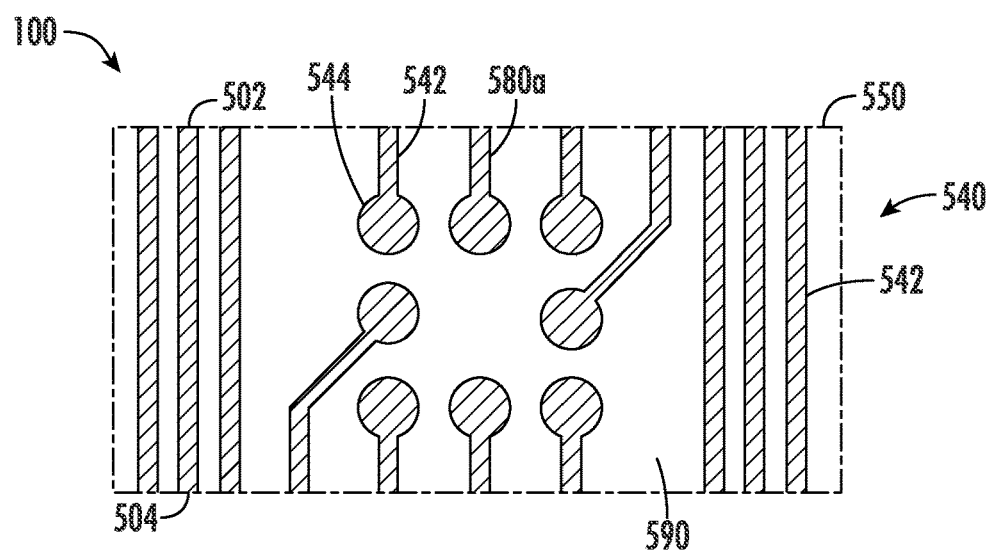

FIGS. 8E and 8F illustrate RDL conductors formed as RDL pads and mounting sites 540 pads and traces for receiving other mounted components. FIG. 8E illustrates a plan view of a portion of a wafer or panel 550, similar to the wafer or panel 50 illustrated in FIG. 2C and wafer or panel 550 illustrated in FIG. 8A. An upper right portion of the circular wafer or reconstituted panel 550 is illustrated, bordered by discontinuity lines 506, which are similar to discontinuity lines 106. The conductive elements 580a, when singulated, also form exposed first ends 502 and exposed second ends 504 that are used for interconnection as part of the 3D blocks 100.

FIG. 8F illustrates an enlarged plan view of a single unit of RDL conductors formed as pads and traces for receiving other components, taken along the detail mark 8F shown in the FIG. 8E. The RDL pads and mounting sites 540 is shown disposed over encapsulant 590. The first conductive element 580a is further shown comprising conductive element 580a that comprises multiple specific instances of conductive element 580a, such as RDL pads and mounting sites 540, first conductive element or traces 542, and second conductive element or pads 544.

Figure 8H:
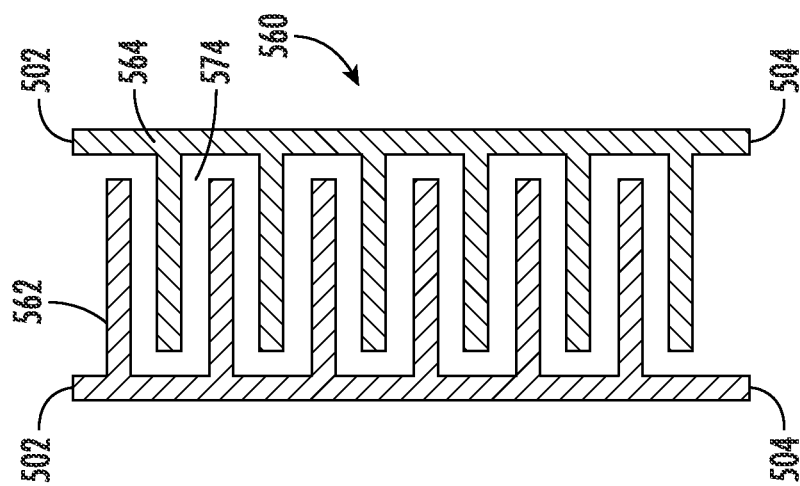
Figure 8G:
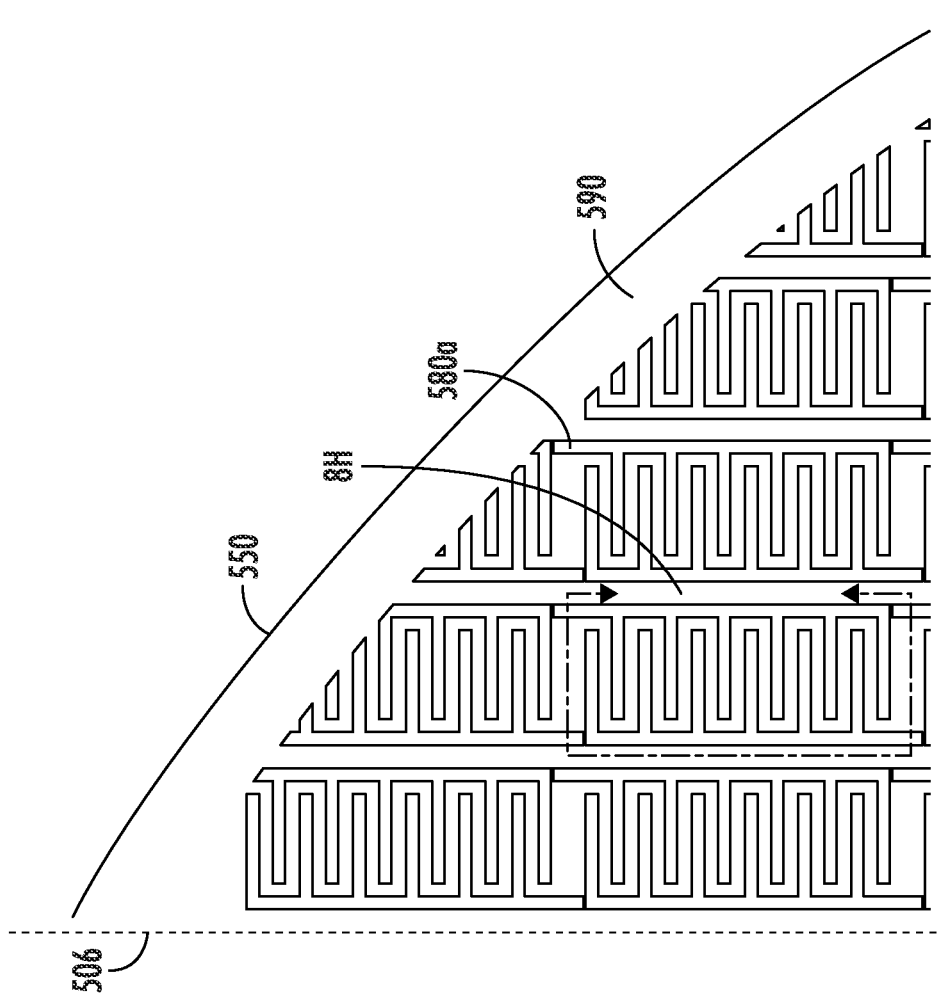

FIGS. 8G and 8H illustrate RDL capacitors 560 formed with interleaved RDL layers 562 and 564, with a dielectric 574 disposed therebetween. FIG. 8G illustrates a plan view of a portion of a wafer or panel 550, similar to the wafer or panel 550 illustrated in FIGS. 8A and 8C. FIG. 8H illustrates an enlarged plan view of a single unit of an RDL capacitor 560, including exposed ends 502 and 504 that can be exposed at upper and lower surfaces of a 3D block 100, in which it is disposed.

FIG. 9 illustrates an enlarged cross-sectional profile view of the portion of FIG. 2D indicated by detail mark 9 from FIG. 2D. FIG. 9 provides detail of an instance in which IPDs 600 may be present or embedded within wafer 60. The IPD 600 may comprise a passivation layer 602 disposed over IPD 600 and around electrically conductive layer or contact or contact pad 604, which provides an interconnect that can be coupled with conducive element 80 or traces 86. Conducive element 80 or traces 86 (including exposed ends 102 and 104), provide routing and connectivity with respect to the IPD 600 and with respect to a 3D block 100 after singulation from the wafer or panel 50.

While this disclosure includes a number of embodiments in different forms, there is presented in the drawings and written descriptions in the following pages detail of particular embodiments with the understanding that the present disclosure is to be considered as an exemplification of the principles of the disclosed methods and systems and is not intended to limit the broad aspect of the disclosed concepts to the embodiments illustrated. Additionally, it should be understood by those of ordinary skill in the art that other structures, manufacturing devices, and examples could be intermixed or substituted with those provided. In places where the description above refers to particular embodiments, it should be readily apparent that a number of modifications may be made without departing from the spirit thereof and that these embodiments and implementations may be applied to other technologies as well. Accordingly, the disclosed subject matter is intended to embrace all such alterations, modifications and variations that fall within the spirit and scope of the disclosure and the knowledge of one of ordinary skill in the art. As such, it will be evident that various modifications and changes may be made thereto without departing from the broader spirit and scope of the inventions as set forth in the appended claims. The specification and drawings are, accordingly, to be regarded in an illustrative sense rather than a restrictive sense.

The invention claimed is:

1. A method of making an assembly or package, comprising:
    providing a first carrier;
    forming a conductive element horizontally oriented over the first carrier, the conductive element comprising conductive traces;
    forming support material around the conductive element;
    singulating the conductive element and the support material to form a plurality of 3D blocks without surface mount devices and removing the 3D blocks from the first carrier;
    providing a second carrier;
    rotating each of the plurality of 3D blocks and mounting the plurality of 3D blocks over the second carrier with the conductive traces of the 3D blocks vertically oriented to form a vertically oriented conductive element, wherein the vertically oriented conductive element comprises a conductive barrier layer disposed along a surface of the vertically oriented conductive trace;
    disposing a plurality of components over the second carrier and disposed laterally offset from each of the plurality of 3D blocks;
    disposing encapsulant over the second carrier and around the plurality of 3D blocks and around the plurality of components to form a reconstituted panel;
    forming a first interconnect structure over a first surface of the reconstituted panel and coupled with first ends of the conductive traces of the vertically oriented conductive element and coupled with conductive contacts on the components; and
    singulating the reconstituted panel and first interconnect structure to form a plurality of individual assemblies.

2. The method of claim 1, wherein the first carrier, the second carrier, or both comprise one or more of a permanent or temporary carrier formed of metal, glass, silicon, semiconductor material, and mold compound.

3. The method of claim 2, wherein the first carrier comprises a permanent wafer that is singulated with the conductive element and the support material to form a portion of the plurality of 3D blocks, wherein the wafer comprises an active semiconductor device, passive device, circuit, or integrated circuit (IC) that is part of the plurality of 3D blocks.

4. The method of claim 1, wherein the conductive element further comprises, or is coupled to, at least a portion of one or more of a capacitor, inductor, shielding, resistor, antenna or antenna feed, voltage regulator, an electrostatic discharge (ESD) protection circuit, a clock or timing circuit, a passive devices for RF tuning, micro lasers, Power Management IC's (PMICs), Integrated Passive Devices (IPDs), Deep Trench Capacitors (DTCs), decoupling capacitors, switches, memory including cache memory, and face down chips.

5. The method of claim 1, wherein the conductive traces are formed as one or more of: medium-density traces with a pitch less than or equal to 100 micrometers (μm), high-density traces with a pitch less than or equal to 50 μm, and as ultra high-density traces with a pitch less than or equal to 20 μm.

6. The method of claim 1, wherein the support material comprises one or more layers of mold compound, polymer material, or dielectric material.

7. The method of claim 1, wherein at least one of the plurality of components comprises an active device.

8. The method of claim 1, wherein at least one of the plurality of components is coupled to one or more of a processor, memory, analog circuit, RF circuit, SMDs, MEMs, sensor, opto-electronic, heat sink, or stack of components.

9. The method of claim 1 further comprising forming a second interconnect structure as a build-up interconnect structure over a second surface of the reconstituted panel opposite the first surface, the second interconnect structure coupled with second ends of the conductive traces.

10. The method of claim 1 further comprising forming the first interconnect structure with unit specific patterning.

11. The method of claim 1, wherein at least two of the plurality of components are disposed in a side by side configuration within an individual assembly after singulation of the reconstituted panel.

12. The method of claim 1, wherein forming the first interconnect structure comprises forming conductive layers over the plurality of 3D blocks using a plating process.

13. The method of claim 1, wherein the conductive contacts on at least one of the plurality of components comprises conductive studs, and the encapsulant directly contacts a sidewall of the conductive studs.

14. A method of making an assembly or package, comprising:
    forming a 3D block comprising a built-up conductive element coupled with a support material such that the support material is disposed at least partially around the conductive element, wherein the conductive element is formed in a horizontal orientation;
    providing a carrier;
    rotating the 3D block so the conductive element is disposed in a vertical orientation and disposing the 3D block over the carrier;
    disposing a component comprising conductive studs over the carrier and laterally offset from the 3D block;
    disposing encapsulant over the carrier, around the 3D block, and around the component and the conductive studs; and
    forming a first interconnect structure over a surface of the encapsulant and coupled with the 3D blocks and the conductive studs.

15. The method of claim 14 further comprising forming the assembly or package without using a glass carrier.

16. The method of claim 14, wherein the vertically oriented conductive element comprises a barrier layer disposed at a lateral surface of the vertically oriented conductive element.

17. The method of claim 14 further comprising cutting the support material to form the 3D block with a cut edge.

18. The method of claim 14 further comprising forming the conductive element with first ends exposed with respect to an encapsulant disposed around the 3D block.

19. The method of claim 14, wherein the conductive element further comprises, or is coupled to, at least a portion of one or more of a capacitor, inductor, shielding, resistor, antenna or antenna feed, voltage regulator, an electrostatic discharge (ESD) protection circuit, a clock or timing circuit, a passive devices for RF tuning, micro lasers, Power Management IC's (PMICs), Integrated Passive Devices (IPDs), Deep Trench Capacitors (DTCs), decoupling capacitors, switches, memory including cache memory, and face down chips.

20. The method of claim 14 further comprising rotating the 3D block so the conductive element is disposed in a vertical orientation and comprises conductive traces formed as one or more of: medium-density traces with a pitch less than or equal to 100 micrometers (μm), high-density traces with a pitch less than or equal to 50 μm, and as ultra high-density traces with a pitch less than or equal to 20 μm.

21. The method of claim 14, wherein the support material comprises one or more layers of mold compound, polymer material, or dielectric material.

22. The method of claim 14 further comprising coupling a stack of components with the components, wherein the components comprises an active device.

23. The method of claim 14 further comprising forming the 3D block with a wave guide comprising optical properties.

24. The assembly of claim 14 further comprising forming the 3D block as a molded block, wherein ends of the molded block are exposed by grinding.

25. The assembly of claim 14, wherein the 3D conductive elements extend through an entire height of the assembly or package.

26. The assembly of claim 14 further comprising forming at least a portion of the first interconnect structure coupled to the 3D block using unit specific patterning.

27. The method of claim 14 further comprising forming a second interconnect structure as a build-up interconnect structure over a second surface of the encapsulant opposite the surface.

28. The method of claim 14, wherein disposing the component comprising conductive studs further comprises disposing at least one additional component in a side by side configuration with the component comprising conductive studs.

29. The method of claim 14, wherein forming the first interconnect structure comprises forming conductive layers over exposed ends of the 3D blocks using a plating process.

30. The method of claim 14, wherein the encapsulant directly contacts a sidewall of the conductive studs.

* * * * *

UNITED STATES PATENT AND TRADEMARK OFFICE
CERTIFICATE OF CORRECTION

PATENT NO. : 12,205,881 B2
APPLICATION NO. : 18/545927
DATED : January 21, 2025
INVENTOR(S) : Timothy L. Olson et al.

It is certified that error appears in the above-identified patent and that said Letters Patent is hereby corrected as shown below:

In the Claims

In Claim 24, Column 28, Line 27, "The assembly of claim 14" should read --The method of claim 14--.

In Claim 25, Column 28, Line 30, "The assembly of claim 14" should read --The method of claim 14--.

In Claim 26, Column 28, Line 33, "The assembly of claim 14" should read --The method of claim 14--.

Signed and Sealed this
Fifteenth Day of April, 2025

Coke Morgan Stewart
*Acting Director of the United States Patent and Trademark Office*